(12) United States Patent
Gardner et al.

(10) Patent No.: US 9,846,467 B2
(45) Date of Patent: Dec. 19, 2017

(54) POWER ROUTING ASSEMBLY FOR DATA CENTER

(71) Applicant: Amazon Technologies, Inc., Reno, NV (US)

(72) Inventors: Brock Robert Gardner, Seattle, WA (US); John William Eichelberg, Spokane, WA (US); Michael Phillip Czamara, Seattle, WA (US); Nigel McGee, Ashburn, VA (US); Peter George Ross, Olympia, WA (US)

(73) Assignee: Amazon Technologies, Inc., Reno, NV (US)

( * ) Notice: Subject to any disclaimer, the term of this patent is extended or adjusted under 35 U.S.C. 154(b) by 810 days.

(21) Appl. No.: 14/181,067

(22) Filed: Feb. 14, 2014

(65) Prior Publication Data

US 2015/0234440 A1 Aug. 20, 2015

(51) Int. Cl.
  *G06F 1/30* (2006.01)
  *G06F 11/20* (2006.01)
  *H05K 7/14* (2006.01)

(52) U.S. Cl.
  CPC ............ *G06F 1/30* (2013.01); *G06F 11/2015* (2013.01); *H05K 7/1492* (2013.01)

(58) Field of Classification Search
  None
  See application file for complete search history.

(56) References Cited

U.S. PATENT DOCUMENTS

| 6,628,009 B1 * | 9/2003 | Chapel ...................... H02J 3/26 307/14 |
| 7,252,524 B1 * | 8/2007 | Johnson, Jr. ........... H01R 25/14 439/114 |

(Continued)

FOREIGN PATENT DOCUMENTS

| EP | 1221706 | 7/2002 |
| JP | 2000-023318 | 1/2000 |

(Continued)

OTHER PUBLICATIONS

U.S. Appl. No. 13/626,723, filed Sep. 25, 2012, Peter G. Ross, et al.

(Continued)

*Primary Examiner* — Rexford Barnie
*Assistant Examiner* — David Shiao
(74) *Attorney, Agent, or Firm* — Robert C. Kowert; Meyertons, Hood, Kivlin, Kowert & Goetzel, P.C.

(57) ABSTRACT

A power routing rack can be used to provide various power support redundancies to one or more computing racks in a data center. Power feeds are supplied to bus bars in a power bus bar array extending through the rack, and power routing assemblies positioned in the rack route power from one or more of the bus bars to a computing rack. Each assembly includes circuit breakers that couple to separate bus bars and a routing module that routes power from one or more of the circuit breakers to one or more computing racks. The routing module can include a transfer switch that selectively routes power. The routing module can include an electrical bridge that concurrently routes power. Each assembly can be positioned within the rack to couple the circuit breakers to various power bus bars to adjust the power support redundancy provided to one or more computing racks.

19 Claims, 12 Drawing Sheets

(56) References Cited

U.S. PATENT DOCUMENTS

| | | | |
|---|---|---|---|
| 7,830,043 B1* | 11/2010 | Michael | G06F 1/189 307/149 |
| 8,500,465 B1 | 8/2013 | Ross et al. | |
| 2002/0105399 A1 | 8/2002 | Kanemaru et al. | |
| 2002/0145339 A1 | 10/2002 | Liu et al. | |
| 2007/0046103 A1* | 3/2007 | Belady | H02G 3/00 307/12 |
| 2007/0217128 A1* | 9/2007 | Johnson, Jr. | H05K 7/1492 361/622 |
| 2007/0217178 A1* | 9/2007 | Johnson, Jr. | H05K 7/1457 361/826 |
| 2010/0141038 A1* | 6/2010 | Chapel | H01R 25/003 307/64 |
| 2011/0187197 A1* | 8/2011 | Moth | H02J 9/062 307/66 |
| 2012/0181869 A1* | 7/2012 | Chapel | H02J 9/06 307/64 |
| 2013/0049476 A1 | 2/2013 | Lathrop | |
| 2014/0183956 A1* | 7/2014 | Wang | H02J 9/062 307/64 |

FOREIGN PATENT DOCUMENTS

| | | |
|---|---|---|
| JP | 2000-102194 | 4/2000 |
| JP | 2005-184993 | 7/2005 |

OTHER PUBLICATIONS

ATS-Cabinet, "Automatic TransferSwitch (ATS) CabinetsSurge Protection," Smiths Power 2013, pp. 1-2.

Datasheet, "S804U-UCZ," ABB, date per Wayback Machine is Feb. 3, 2013, pp. 1-2.

Switches, "Automatic Transfer Switches," date per Wayback Machine is Dec. 22, 2009, ABB, pp. 1-20.

International Search Report and Written Opinion in PCT/US2015/015918, dated Jul. 29, 2015, Amazon Technologies, Inc., pp. 1-16.

Office Action from Japanese Application No. 2016-551731, dated Jul. 25, 2017, Amazon Technologies, Inc., Pages.

\* cited by examiner

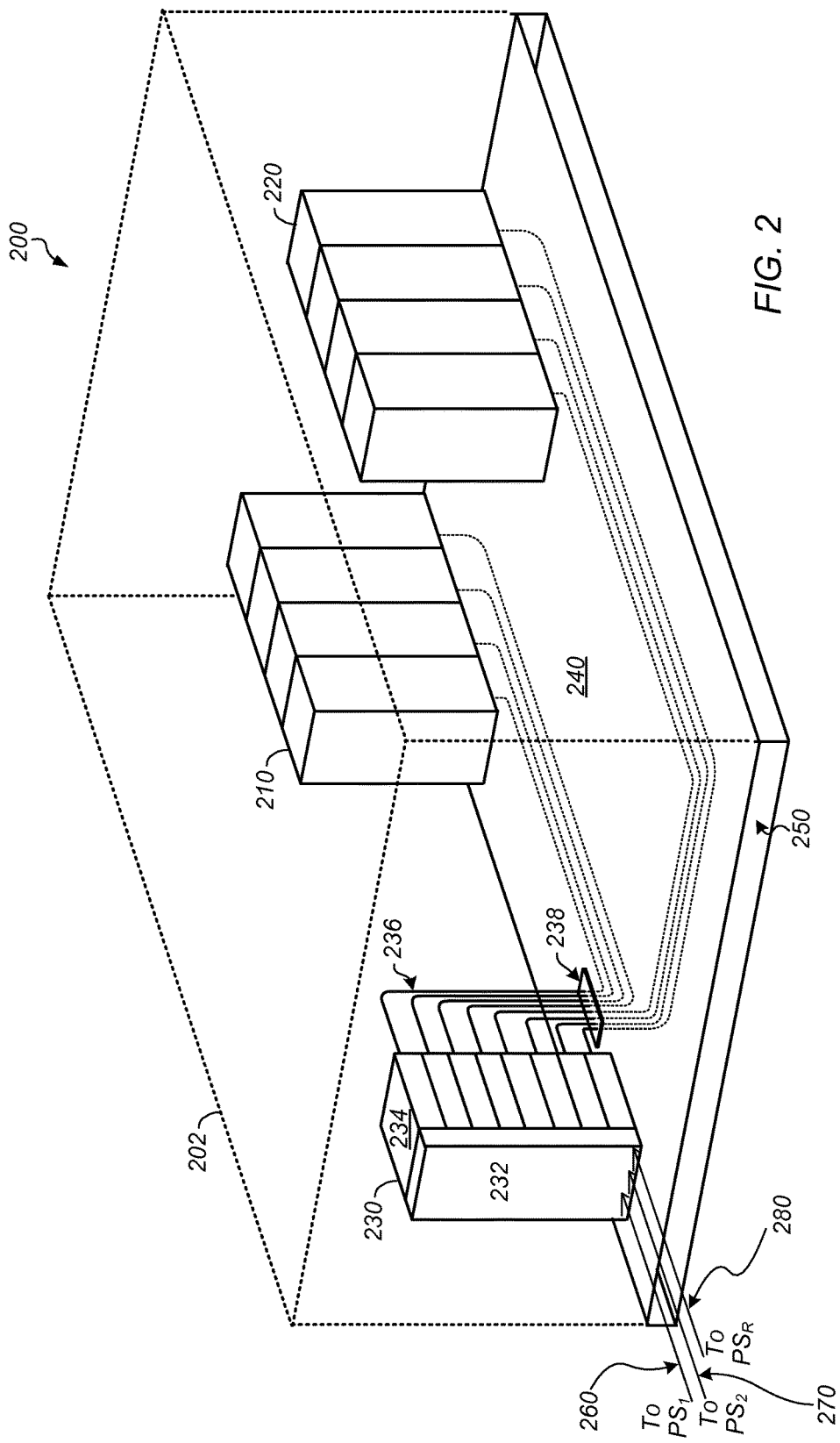

POWER ROUTING ASSEMBLY FOR DATA CENTER

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many computing racks, which may include server racks. Each computing rack, in turn, may include many computer systems, servers, associated computer equipment, etc.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 208V). A network of cabling, bus bars, power connectors, and power distribution units, is used to deliver the power at the lower voltage to numerous specific components in the facility.

Some data centers have no redundancy at the PDU level. Such data centers may have a large affected zone when a UPS or PDU failure in the power system occurs. In addition, some data centers have "single threaded" distribution via the electrical supply to the floor, and in which maintenance can only be performed when the components are shut-off. The down-time associated with maintenance and reconfiguration of primary power systems in a data center may result in a significant loss in computing resources. In some critical systems such as hospital equipment and security systems, down-time may result in significant disruption and, in some cases, adversely affect health and safety.

Some systems include dual power systems that provide redundant power support for computing equipment. In some systems, an automatic transfer switch ("ATS") provides switching from a primary power system to a secondary (e.g., back-up) power system. In a typical system, the automatic transfer switch automatically switches a computing rack to the secondary system upon detecting a fault in the primary power. To maintain the computing equipment in continuous operation, the automatic transfer switch may need to make the transfer to secondary power system rapidly (for example, within about 16 milliseconds).

Some data centers include back-up components and systems to provide back-up power to servers in the event of a failure of components or systems in a primary power system. In some data centers, a primary power system may have its own back-up system that is fully redundant at all levels of the power system. Such a level of redundancy for the systems and components supported by the primary and fully-redundant back-up system may be referred to as "2N" redundancy. For example, in a data center having multiple server rooms, one or more server racks may receive power support from a primary power system and fully-redundant back-up power system. The back-up system for each server room may have a switchboard, uninterruptible power supply (UPS), and floor power distribution unit (PDU) that mirrors a corresponding switchboard, uninterruptible power supply, and floor power distribution unit in the primary power system for that server room. Providing full redundancy of the primary power systems may, however, be very costly both in terms of capital costs (in that in may require a large number of expensive switchboard, UPSs, and PDUs, for example) and in terms of costs of operation and maintenance. In addition, with respect to the primary computer systems, special procedures may be required to switch components from the primary system to a back-up system to ensure uninterrupted power supply for the servers, further increasing maintenance costs. As a result, some data centers may include a back-up system that is less than fully redundant for a primary power system. Such a level of redundancy for the systems and components supported by the primary and fully-redundant back-up system may be referred to as "N+1" redundancy. While N+1 redundancy may not provide fully-redundant reserve power support for computing equipment, such redundancy may involve lower capital and operating costs.

Some systems include one or more power systems that provide power concurrently to a set of computing equipment independently of a switching between the power servers upstream of the set of computing equipment. Such systems may provide 1N redundancy, 2N redundancy, etc. for the computing units.

In some data centers, some sets of computing equipment may be configured for power support of various types of redundancy. For example, some server racks having servers configured for critical tasks may receive 2N reserve power support, some server racks may receive N+1 reserve power support, and some server racks may receive a concurrent supply of power from one or more separate power feeds independently of an upstream transfer switch. Configuring each rack for a particular type of power redundancy with support from particular power systems may be costly and time-consuming, as each configuration may require specific configurations of specific upstream systems and components to establish a given power support redundancy for a given server rack.

As a result, providing various power support redundancies, from various power sources, to various sets of computing equipment in a data center may require excessive expenditures of time, resources, and data center floor space, wall space, etc. to provide specific systems and components for each particular power support redundancy type from each particular power system used to provide such redundancies. In addition, due to the specific systems and components, and configurations thereof, required to provide a given redundancy, changing a power support redundancy for a particular set of computing equipment may be time consuming and expensive, as such changes may require re-arrangement, addition, removal, etc. of various systems and component configurations specific to providing such redundancies. Such changes may further require extended computing unit downtime to implement changes in specific systems and components, as such reconfigurations of various systems and components in a data center may require temporarily taking otherwise unrelated systems and components offline, thereby exacerbating costs.

BRIEF DESCRIPTION OF THE DRAWINGS

FIG. 2 is a schematic illustrating a perspective view of a data center having separate sets of racks receiving separate types of power support redundancy via power routing assemblies in a common power routing rack according to some embodiments.

Figure 1:
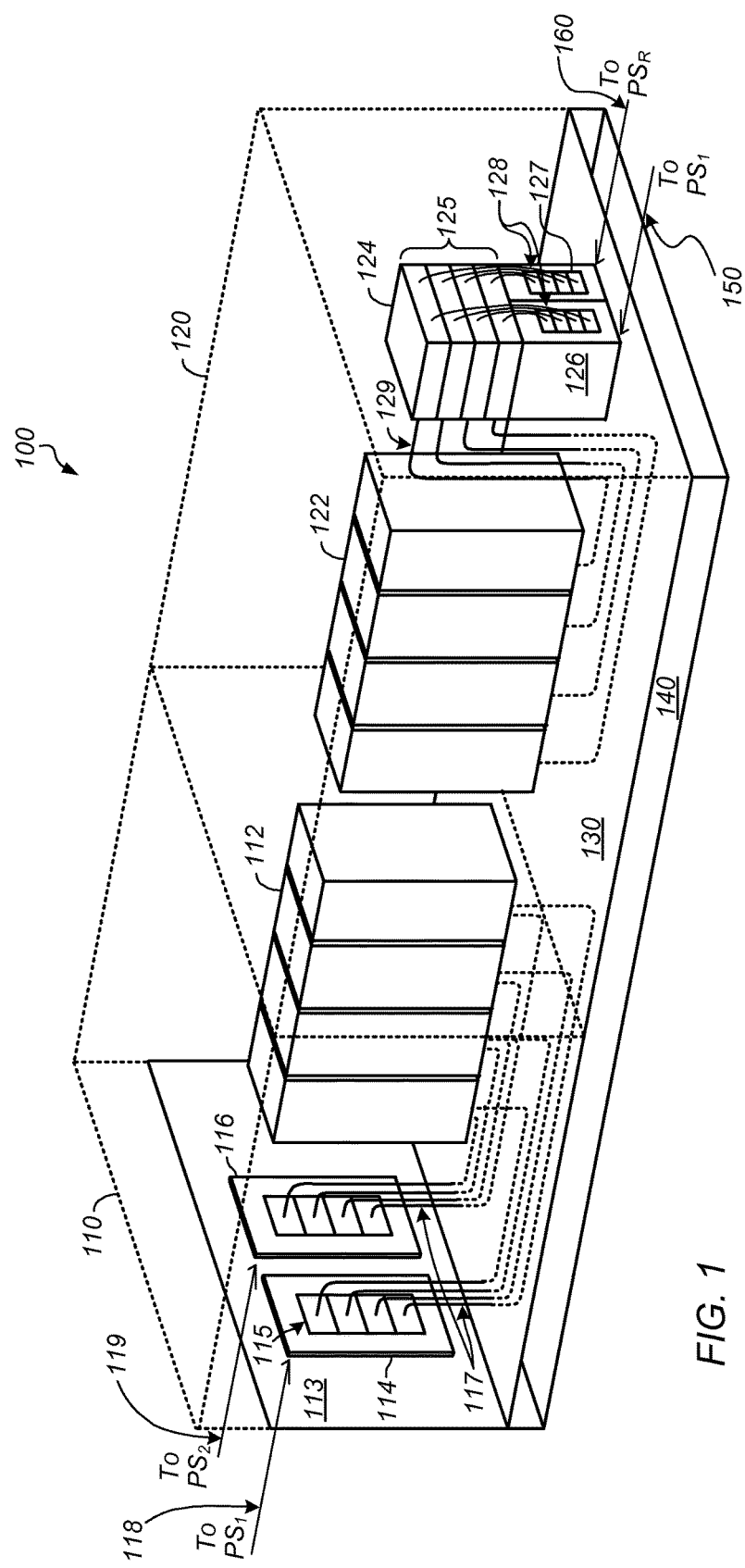
FIG. 1 is a schematic illustrating a perspective view of a data center having separate sets of racks receiving separate types of power support redundancy according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of power routing assemblies and power bus arrays for providing configurable power support redundancies to computer systems in a data center via a power routing rack are disclosed. According to one embodiment, a data center includes a primary power system that supplies a primary power feed, a reserve power system that supplies a reserve power feed, a plurality of computing racks that each includes sets of computer systems, and one or more power routing racks. A power routing rack includes a power bus array and multiple power routing assemblies. The power bus array includes primary power bus bars and reserve power bus bars that carry the primary power feed and the reserve power feed, respectively, in parallel along a common side of the power routing rack. Each power routing assembly is mounted in a separate position in the power routing rack and routes one or more of the primary or reserve power feeds to one or more of the sets of computer systems. Each power routing assembly includes two circuit breaker modules that reversibly couple with a separate power bus bar and route a corresponding power feed, via a respective power output connection, to a power routing module connected to each circuit breaker module that routes one or more of the routed power feeds to the one or more sets of computer systems.

According to one embodiment, an apparatus includes a power routing assembly that is mounted in a portion of a power routing rack. The power routing assembly includes a power routing module and two or more circuit breaker modules. Each circuit breaker module reversibly couples with a separate power system via a separate power bus bar and selectively routes a power feed supplied from the power system via the coupled power bus bar to an output connector of the respective circuit breaker module. The power routing module is coupled to each of the output connectors of the circuit breaker modules via a respective power input connector and is also coupled to a downstream electrical load via a power output connector. The power routing modules routes at least one power feed from at least one of the circuit breaker modules to the electric load via the respective input connector.

According to one embodiment, a method includes assembling a power routing assembly and configuring the power routing assembly to provide a particular power support redundancy to a downstream electrical load. Assembling the power routing assembly includes coupling circuit breaker modules to separate power connectors of a power routing module. Configuring the power routing assembly to provide the particular power support redundancy to the electric load comprises configuring each of the circuit breaker modules to route separate power feeds from a power bus array to the routing module via separate power connectors and configuring the power routing module to route at least one of the separate power feeds received from the circuit breaker modules to the downstream electrical load. Configuring each circuit breaker module to route separate power feeds includes coupling each of the circuit breaker modules to separate power bus bars of the power bus array. Configuring the power routing module to route at least one of the separate power feeds includes coupling the power routing module to the electrical load via a power output connection.

As used herein, "computer room" means a room of a building in which computer systems, such as rack-mounted servers, are operated.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "operating power" means power that can be used by one or more computer system components. Operating power may be stepped down in a power distribution unit or in elements downstream from the power distribution units. For example, a server power supply may step down operating power voltages (and rectify alternating current to direct current).

As used herein, providing power "support" refers to providing one or more power feeds to be available to one or more downstream systems and components, including one or more electrical loads. Such provided power feeds may be precluded from being received by the systems and components but may be made available for receipt based at least in part upon a positioning of one or more components upstream of the systems and components. For example, a reserve power system may provide reserve power support to an electrical load by providing a reserve power feed that can be selectively routed to the load by a transfer switch that is downstream of the reserve power system and upstream of the load, where the transfer switch may selectively route the reserve power feed or a primary power feed to the load based at least in part upon one or more conditions associated with the primary power feed.

As used herein, "power distribution unit", also referred to herein as a "PDU", means any device, module, component, or combination thereof, which can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.).

As used herein, "primary power" means any power that can be supplied to an electrical load, for example, during normal operating conditions. A power distribution system (also referred to herein as a "power system") that distributes primary power may be referred to as a primary power system.

As used herein, "floor power distribution unit" refers to a power distribution unit that can distribute electrical power to various components in a computer room. In certain embodiments, a power distribution unit includes a k-rated transformer. A power distribution unit may be housed in an enclosure, such as a cabinet.

As used herein, "rack power distribution unit" refers to a power distribution unit that can be used to distribute electrical power to various components in a rack. A rack power distribution may include various components and elements, including wiring, bus bars, connectors, and circuit breakers.

As used herein, "reserve power" means power that can be supplied to an electrical load upon the failure of, or as a substitute for, primary power to the load. A power distribution system (also referred to herein as a "power system") that distributes reserve power may be referred to as a reserve power system.

As used herein, "source power" includes power from any source, including but not limited to power received from a utility feed. In certain embodiments, "source power" may be received from the output of another transformer (which is sometimes referred to herein as "intermediate power").

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

FIG. 1 is a schematic illustrating a perspective view of a data center having separate sets of racks receiving separate types of power support redundancy according to some embodiments. Data center 100 includes computing rooms 110 and 120, racks 112 and 122, power feeds 118, 119, 150, 160, circuit breaker panels, 114, 116, and transfer switch cabinet 124. Sets of computer systems in racks 112, 122 may perform computing operations in data center 100. Computer systems may be, for example, servers in one or more server rooms 110, 120 of data center 100. Computer systems in racks 112, 122 may each receive power from one of various power feeds. In some embodiments, each power feed corresponds to a separate power system supplying power from one or more various power sources. For example, in the illustrated embodiment, each of power feeds 118 and 150 are received from a primary power system ("$PS_1$") which may supply power from one or more various power sources, including one or more utility sources. In addition, power feed 119 is received from another primary power system ("$PS_2$") which may supply power from one or more various power sources, including one or more utility sources, which may be separate from power sources supplying power to the $PS_1$ primary power system. Furthermore, power feed 160 is received from a reserve power system ("$PS_R$") which may supply power from one or more various power sources, including one or more utility sources, and may provide reserve power support to one or more computer systems in data center 100. In some embodiments, one or more reserve power systems are powered up at all times during operation of data center 100. One or more reserve power systems may be passive until a failure of one or more components of one or more feeds 118, 119, 150 of one or more primary power systems, at which time the reserve power system may become active and supply power through a reserve power feed 160.

In some embodiments, some or all of a reserve power system is oversubscribed to one or more electrical loads. As used herein, "oversubscribed" refers to a condition in which total power requirements of the systems coupled to a reserve power system exceed the capacity of some or all of the reserve power system to supply reserve power (which includes, for example, exceeding the capacity of a subsystem such as a reserve UPS). For example, a reserve power system supplying power feed 160 might be electrically coupled to all four racks 122, but only be able to provide reserve power to one of the racks 122 at any given time through a downstream component. In some embodiments, a reserve power system may be heavily oversubscribed (for example, subscribed at several times the capacity of the reserve power system). In certain embodiments, oversubscription is applied at a facility-wide level.

In some embodiments, various primary power systems and reserve power systems supply power to various electrical loads in a data center, including computer systems located in racks. The various power systems may include various systems and components (not shown in FIG. 1), which may include switchgear configured to selectively route source power from various power sources, uninterruptible power supplies (UPS), static switches that provide bypass of one or more UPSs, one or more transformers that step down source power to a lower voltage (e.g., 415 volts), one or more power distribution units that distribute power from a power system to one or more electrical loads, etc. Power output from one or more of the various power systems in data center 100 may be supplied to computer systems in various racks in various computing rooms through one or more downstream systems and components.

In some embodiments, the one or more systems and components downstream of various power systems and upstream of one or more particular racks are configured to provide one or more particular power support redundancies provided to the computer systems in the particular racks, including 1N redundancy, 2N redundancy, N+1 redundancy, etc. Specific systems and components, and specific configurations thereof, may be implemented in a data center to provide one or more of the particular power support redundancies. For example, in the illustrated embodiment, data center 100 includes computing rooms 110 and 120 that each include racks 112, 122 of computer systems with separate power support redundancies. Rooms 110, 120 receive various power feeds 118, 119, 150, 160 from various power systems and supply power from one or more of the power feeds to each various racks 112, 122 in the respective room via various power lines 117, 129, which may extend through a raised floor plenum 140 under a data center raised floor 130. For example, in some data center embodiments, various computer rooms may include a raised floor plenum formed at least in part through installation of a raised floor in the room; such a raised floor plenum may be used at least in part to circulate cooling air through the room, route power lines and various other systems and components.

In some embodiments, various portions of a data center include various racks of computer systems for which various separate power support redundancies are provided. Such various redundancies may be provided based at least in part upon specific configurations of specific systems and components downstream of one or more power systems and upstream of the racks. One or more specific systems and components that is configured to provide a particular power support redundancy may be referred to as being in a particular power support redundancy configuration. For example, in the illustrated embodiment, data center 100 includes two computing rooms 110, 120 with racks for which separate power redundancies are provided via one or more specific systems and components in one or more particular power support redundancy configurations. Room 110 includes racks 112 that receive power feeds 118, 119 from two separate primary power systems. Each primary power system may be configured to provide a fully-redundant source of power to each computer system in racks 112 (i.e., a 2N redundancy). In some embodiments power from only one power source may be routed to one or more computer systems (i.e. a 1N redundancy). In the illustrated embodiment, circuit breakers 115 are located downstream of each power feed and upstream of each rack 112 and provide breaker support for each power feed supplied to each rack. The breakers 115 can switch to isolate one or more power systems from one or more computer systems in racks 112. In the illustrated embodiment, each panel 114, 116 of circuit breakers provides breaker support for a particular corresponding power feed 118, 119, and breakers in each panel provide breaker support for the corresponding feed for a particular one of racks 112. Power may be routed through a given circuit breaker 115 out to a given rack through a power line 117, which may include a cable. In some embodiments, one or more switching devices (e.g., an automatic transfer switch or "ATS") are located in a given rack 112 and selectively switch between routing power from one of power feeds 118, 119 into one or more computer systems. In some embodiments, power from both power feeds is routed concurrently to one or more computer systems in a rack 112.

Computing room 120 in data center 100 illustrates another power redundancy configuration, where power from one primary power system and one reserve power system are selectively routed to one or more computer systems in one or more racks 122 through one or more transfer switches 125, which may include one or more automatic transfer switches ("ATS"). Automatic transfer switches 125 may control switching of power to computer systems in one or more racks 122 between a primary power feed 150 from a primary power system and a reserve power feed 160 from a reserve power system. In some embodiments, one automatic transfer switch is provided for each rack in a computer room. Thus, an automatic transfer switch 125 may switch input power to a corresponding rack 122 between power feed 150 and power feed 160. In another embodiment, an automatic transfer switch is provided for each half of a rack. In still another embodiment, automatic transfer switches may be provided at the server level.

As shown, power feeds 150, 160 supply power from a primary power system and a reserve power system, respectively, into the room 120. Both power feeds are routed into a transfer switch cabinet 124, where the feeds are each are supplied to various transfer switches 125 via corresponding circuit breakers 127 in a circuit breaker panel 126 that is also located in cabinet 124. The illustrated embodiment shows the breaker panel being located vertically adjacent to one or more circuit breakers 125; in some embodiments, the circuit breakers 127 may be located horizontally adjacent to one or more corresponding transfer switches 125. Power output from each circuit breaker 127 may be supplied to a corresponding transfer switch 125 through one or more cables, connectors, and the like 128. Such components 128 may include, for example, a combination of jumpers, cables, and electrical connectors. Each transfer switch 125 in cabinet 124 selectively routes power from one of the power feeds 150 and 160, which were each routed to the transfer switch 125 via a corresponding set of circuit breakers 127 and connectors 128, to one or more racks 122 via output power line 129, which may include one or more electrical connectors, cables, jumper connections, and the like. Such selective routing of one or more power feeds by transfer switches 125 may enable one or more transfer switches 125 to provide N+1 redundancy for one or more computer systems in rack 122. In some embodiments, power feed 160 may supply power from another primary power system (e.g., $PS_2$), such that one or more of the transfer switches 125 provides 2N redundancy to one or more computer systems in racks 122.

The above-described data center illustrates that providing various power support redundancies for various electrical loads, with various power systems, may include specific systems and components configured to implement specific power support redundancy configurations. Such specific systems and components may take up resources including capital and operating cost and space within a data center that could otherwise be allocated to other systems and components. Furthermore, as shown in the illustrated embodiments, some systems and components that are "specific" to one or more power redundancy configurations may take up different types of space in a data center. For example, the circuit breaker panels 116, 116 in room 110 are mounted on a wall panel 113 of the room 110, while the transfer switch cabinet 124 in room 120 is installed on the raised floor 130. Wall space in a data center may be limited and various items may compete for use of such limited space, including crash carts, tool storage, electrical distribution systems and components, mechanical plants, etc. Furthermore, as illustrated, installing separate systems and configurations with different footprints in order to provide different power support redundancies to different electrical loads in the data center may frustrate efficient allocation of limited data center resources.

Furthermore, changing a particular power support redundancy configuration for one or more computer systems in a data center may be costly and difficult, due to the specific configurations of systems and components used to provide each power support redundancy. For example, changing one of racks 122 to receive 2N power support could require running an additional power feed (not shown) into room 120, such as from power system $PS_2$, and may further require configuring one or more circuit breakers to route power from the additional power feed to a transfer switch for the particular rack 122, etc. Such operations may be time-consuming and may require taking additional racks off-line, such as where running a new power feed cable into cabinet 124 and changing one or more circuit breaker couplings includes decoupling some or all components in cabinet 124 from power to enable safe operations, thereby potentially taking all racks 122 offline. Such operations may also include changing various connections in the cabinet 124, which may include reconfiguring various cable connections in the cabinet, which may impose additional operation costs. Additionally, once such a changeover for one or more racks 122 is complete, identifying which racks 122 are receiving 2N redundancy and which are receiving N+1 redundancy may be difficult and involve careful inspection of cables, connectors, etc. in cabinet 124.

In addition, switching one or more racks between receiving power support redundancy through a transfer switch, as illustrated with regard to room 120, and receiving power support redundancy independent of a transfer switch upstream of the rack, as illustrated with regard to room 110, may be particularly costly and difficult based at least in part upon the distinct footprints of the transfer switch cabinet 124 and the circuit breaker panels 114, 116. For example, changing one of racks 112 in room 110 from 2N redundancy independent of an upstream transfer switch to receiving N+1 redundancy with an upstream transfer switch may include installing a cabinet 124 in room 110, which might involve allocating at least some floor space to the cabinet 124. As a result, providing various power support redundancies in room 110 would involve allocating wall space 113 for circuit breakers 115 to support some racks 112 and allocating floor space 130 for a cabinet 124 including at least one transfer switch 125 to support at least one rack 112.

Similarly, changing one of racks 122 in room 120 from N+1, 2N, etc. redundancy through an upstream transfer switch 125 to receiving power support redundancy independent of a transfer switch may include mounting at least one circuit breaker panel 114 in room 120, which would take away wall space that could be allocated to other purposes. Thus, changing allocations of redundancy-specific systems and components to different spaces to support changing redundancy configurations of such systems and components could be a less than optimal allocation of data center resources.

FIG. 2 is a schematic illustrating a perspective view of a data center having separate sets of racks receiving separate types of power support redundancy via power routing assemblies in a common power routing rack according to some embodiments. Data center 200 includes computer room 202, racks 210, 200, power feeds 260, 270, 280, raised floor plenum 250, and power routing rack 230.

In some embodiments, a data center includes a power routing rack that provides various power support redundancies for various computer systems. Various systems and components in the power routing rack may be configurable, adjustable, etc. to provide one or more particular power support redundancies for one or more particular racks and computer systems therein, and such systems and components may be adjustable within the power routing rack to change the redundancy configuration of such systems and components, such that the systems and components provide a different power support redundancy. Such systems and components may be configured to be at least partially adjusted without affecting power support for other racks in the data center supported at least in part by other systems and components in the power routing rack, and the power support redundancy configuration of such systems and components may be immediately ascertainable to an observer of at least a portion of the power routing rack.

In some embodiments, a power routing rack includes a power bus array and one or more power routing assemblies mounted therein the rack. The power bus array may carry power from one or more power feeds, each of which may supply power from one or more various power sources via one or more various power systems. A power bus array may include an array one or more power bus bars that are each configured to carry at least some power from one or more particular power feeds, and the array of bus bars may extend in parallel along one or more particular sides at least a portion of power routing rack. For example, in the illustrated embodiment, power routing rack 230 includes a power bus array 232 that extends vertically along one side of the rack 230. The power bus array may include an array of bus bars that extend in parallel along one or more sides of a portion of the rack that can include one or more assemblies 234. The bus bars may extend in a manner other than parallel along one or more sides of other one or more portions of the rack, including one or more portions in which power routing assemblies 234 are absent. The array 232 is shown to receive three particular power feeds 260, 270, 280, where each feed supplies power from one of a first primary power system ($PS_1$), a second primary power system ($PS_2$), and a reserve power system ($PS_R$), respectively. As discussed further below, a power bus array such as array 232 may include multiple sets of power bus bars that each carry power from one of the power feeds, and one or more systems and components electrically coupled to a given one or more sets of power bus bars may receive power from the corresponding power feed.

In some embodiments, one or more power routing assemblies in a power routing rack include one or more systems and components that can be adjustably configured to route power from one or more various power feeds to one or more downstream electrical loads, including computer systems in a computing rack, which may include servers in a server rack. For example, in the illustrated embodiment, rack 230 includes eight power routing assemblies 234 that each routes power from one or more of power feeds 260, 270, and 280. Each power routing assembly 234 is electrically coupled to at least one power bus bar in power bus array 232 to receive power from at least one of the power feeds 260, 270, 280 and routes power to a corresponding computing rack via an output line 236. As shown, power lines in some embodiments are routed to corresponding racks through a raised floor plenum 250 beneath a raised floor 240. Such lines 236 may be routed into plenum 250 via a portal element 238, and each line may be routed upwards from plenum 250 into a corresponding rack through another portal element (not shown).

In some embodiments, each power routing assembly 234 is configured to be at least partially adjusted within rack 230 to adjustably configure the power routing assembly provide one or more various power support redundancies to one or more downstream computing racks. Such adjustments may include adjusting at least a portion of the assembly 234 itself to electrically couple to various power bus bars in array 232, so that the assembly 234 routes power from various power feeds. For example, a given power routing assembly 234 may be electrically coupled to a first power bus bar carrying power from power feed 260 and electrically coupled to another power bus bar carrying power from power feed 270, and the assembly 234 may selectively route power from one of power feeds 260, 270 to one of racks 210, 220, which may include providing 2N redundancy for that rack. Additionally, the given power routing assembly 234 may be at least partially adjusted to switch from coupling to the power bus bar carrying power from power feed 270 to yet another power bus bar carrying power from power feed 280, and the assembly may selectively route power from one of power feeds 260, 280 to one of racks, 210, 200, which may include providing N+1 redundancy for that rack. Such adjustments to an assembly may include at least partially adjusting a configuration of one or more components of the assembly 234 with respect to one or more power bus bars in array 232 to align the one or more components to couple to the one or more power bus bars. Such adjustments may include, in addition or alternative, adjusting a position, mounting, etc. of the entire assembly 234 within rack 230 to align one or more components of assembly 234 to couple to one or more various power bus bars in the array 232. Such adjustment may include adjusting the assembly vertically with respect to the rack 230, horizontally with respect to the rack, some combination thereof, or the like. For example, and as discussed further below, within a portion of rack 230, along at least one side of which the power bus bars in array 232 extend vertically in parallel, assembly 234 may be adjustable horizontally with respect to rack 230 to change at least part of the assembly 234 from aligning with one or more sets of power bus bars to aligning with one or more other sets of power bus bars, where each set of power bus bars collectively carries power from a separate combination of power feeds. Thus, adjusting an assembly 234 with respect to rack 230 may configure the assembly to route power from separate combinations of one or more power feeds, thereby potentially providing separate power support redundancies to various downstream computing racks. Furthermore because the redundancy configuration of a given assembly 234 may be at least partially based upon its position within rack 230, various assemblies 234 in rack 230 may provide different power support redundancies to various different computing racks. For example, in the illustrated embodiment, assemblies 234 coupled to computing racks 210 via lines 236 may each be coupled to power bus bars carrying power from power feeds 260 and 270, such that those assemblies 234 provide 2N power support redundancy to each of computing racks 210, while other assemblies 234 coupled to computing racks 220 via other lines 236 may be coupled to power bus bars carrying power from power feeds 260 and 280, such that those other assemblies provide N+1 power support redundancy to each of computing racks 220.

In some embodiments, one or more power routing assemblies include systems and components configured to provide breaker support to downstream loads for one or more particular power feeds. Such breaker support may be provided at least in part by a circuit breaker that can switch to isolate a particular power feed from the power routing assembly and one or more downstream electrical loads. For example each assembly 234 may include one or more coupling modules that electrically couple with separate power bus bars to route power from the corresponding power bus bar to a power routing module that routes power from one or more of the coupling modules to a downstream computing rack. Each coupling module may be coupled to a power bus bar connector that adapts the circuit breaker connector to couple with a power bus bar. One or more of the coupling modules may include one or more circuit breakers that provide breaker support for the power routed through the one or more coupling modules In some embodiments, one or more of the coupling modules, which may include one or more circuit breakers, is configured to couple directly to one or more power bus bars. A power routing module may include one or more switching devices, including an ATS, which can selectively route power from one of the circuit breaker modules to a computing rack. In another example, a power routing module may include an electrical bridge that, rather than selectively routing power from one of the circuit breaker modules, concurrently routes power from both circuit breaker modules to a computing rack. As a result, various assemblies 234 in a given power routing rack 230 can provide one of the various power support redundancies discussed above with reference to rooms 110 and 120 FIG. 1 with a single rack 230, rather than allocating wall space to a circuit breaker panel for supplying power to some racks independently of transfer switches and allocating floor space to a transfer switch cabinet for selectively supplying power to other racks.

As a result, a given power routing rack may provide various power support redundancies to various computing racks in a data center, and a single allocation of data center space may be used to provide the various redundancies (e.g., using only one or more floor space footprints without allocating wall space to circuit breaker panels). Adjustment of a given power routing assembly 234 may change the particular power support redundancy configuration of that assembly 234 by changing which power bus bars the assembly 234 is coupled to, and such couplings may be visible to an observer, thus enabling the redundancy configuration of a given assembly 234 to be immediately ascertained. Additionally, changing a rack from receiving power support through a transfer switch and receiving power support independently of a transfer switch may be accomplished through swapping the supporting assembly 234 from an assembly including a power routing module with a transfer switch to an assembly including a power routing module with an electrical bridge. Such swapping capability of assemblies in rack 230 may enable faster and more efficient changes of power support redundancy configurations without allocating wall space to circuit breaker panels that may be used for transfer switch-independent redundancy configurations.

Figure 3A:
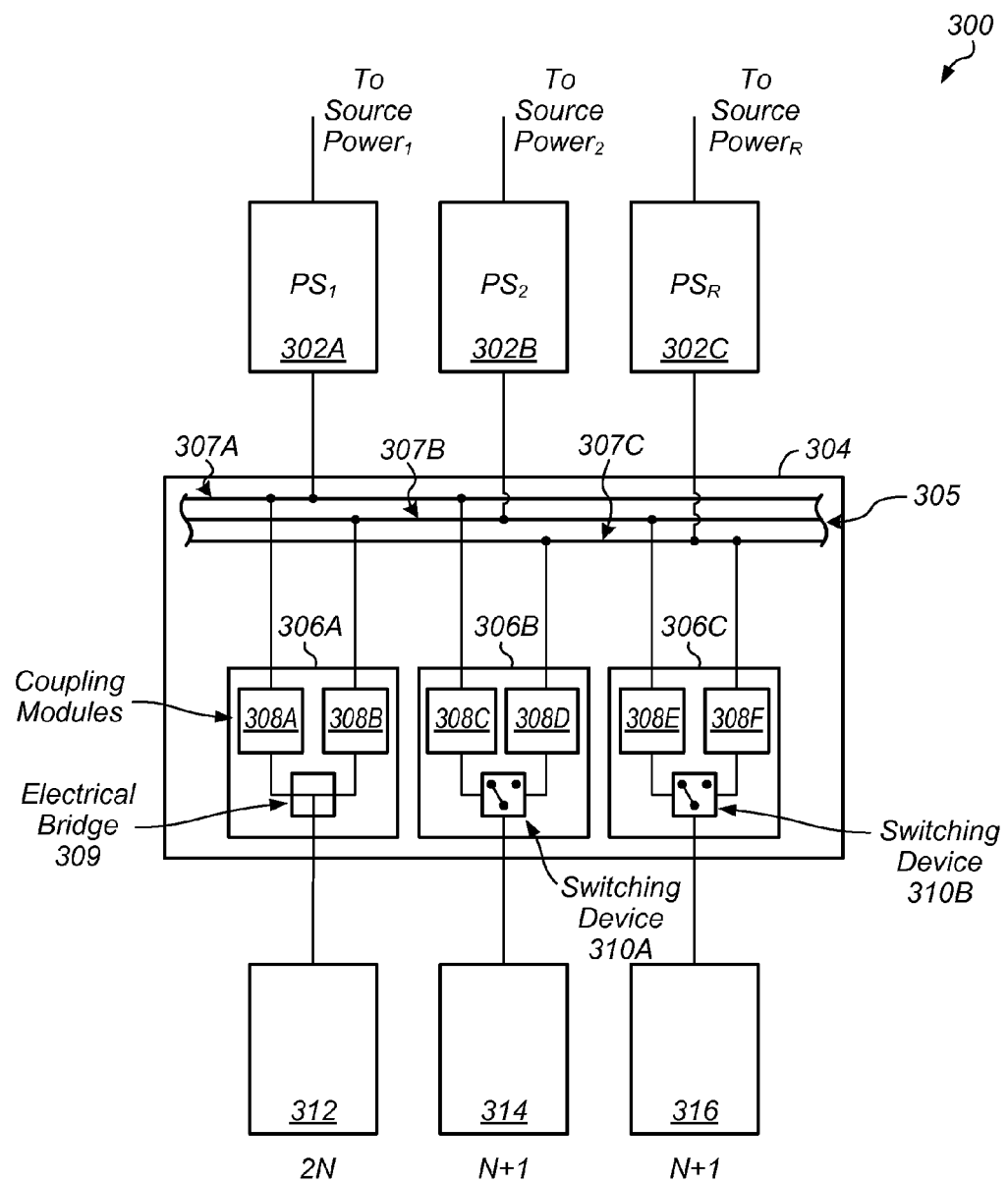
FIG. 3A and FIG. 3B are schematics illustrating a power routing rack that includes power routing assemblies providing various power support redundancies to various computer racks via various power routing assemblies coupled to various power buses of a power bus array according to some embodiments.
Figure 3B:
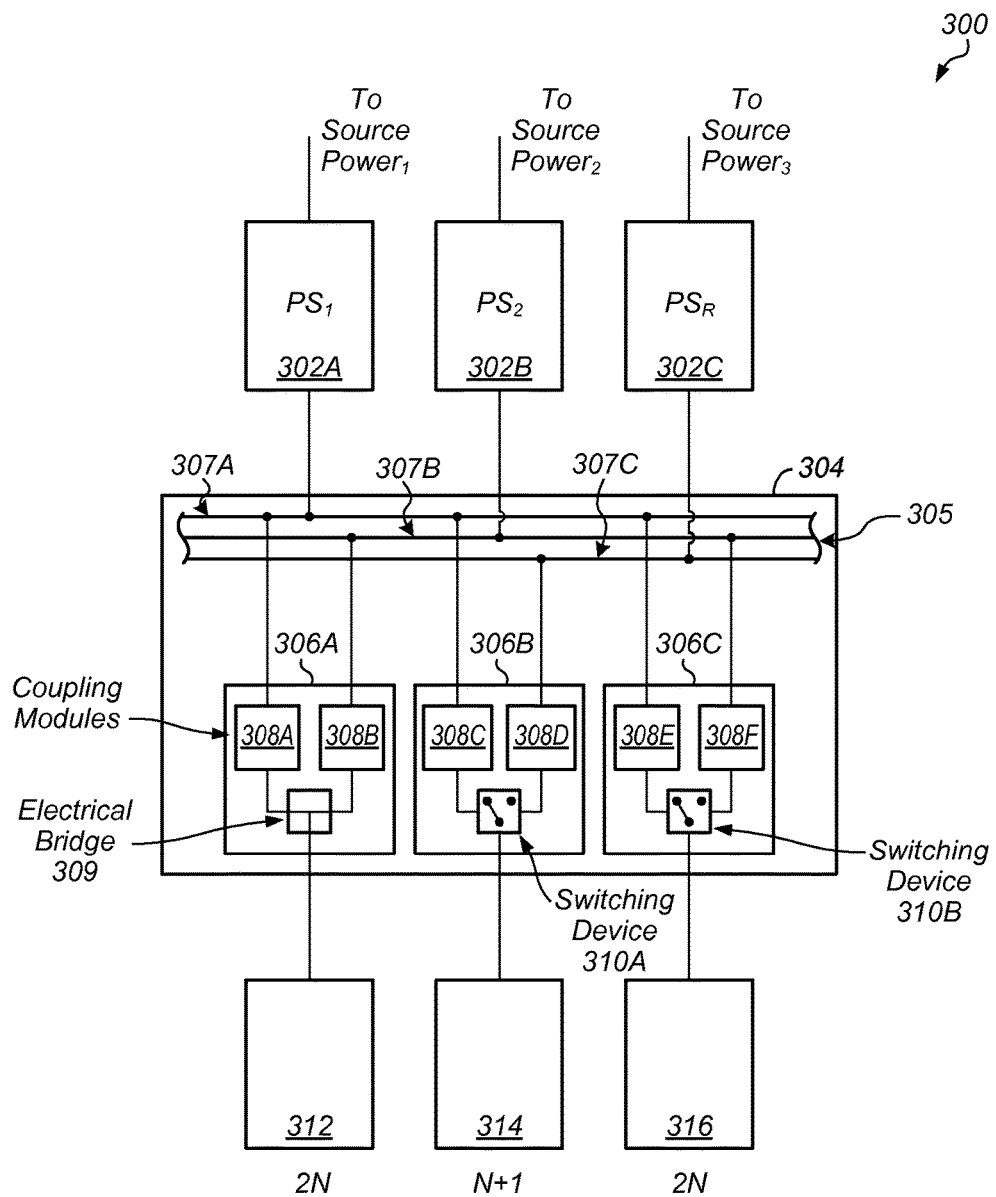

FIG. 3A and FIG. 3B are schematics illustrating a power routing rack that includes power routing assemblies providing various power support redundancies to various computer racks via various power routing assemblies coupled to various power buses of a power bus array according to some embodiments. In each figure, data center 300 includes three power systems 302A-C that supply power from one or more source powers to a power routing rack 304 that provides various power support redundancies, using power from various combinations of the power systems, to three computing racks 312, 314, 316.

Power routing rack 304 includes a power bus array 305 and power routing assemblies 306A-C. In some embodiments, a power bus array includes one or more sets of power bus bars extending in parallel along one or more sides of at least a portion of the power routing rack, where the portion of one or more sides of the rack can include one or more assemblies 306A-C and where one or more of the power bus bars carry power received from a separate power source. For example, in the illustrated embodiment, power bus array 305 includes three power bus bars 307A-C, where each power bus bar is electrically coupled to a separate power system. Power bus bar 307A carries power received from power system 302A, power bus bar 307B carries power received from power system 307B, and power bus bar 307C carries power received from power system 302C. As a result, a device electrically coupled with various ones of the power bus bars 307A-C may receive power from one or more of the separate power systems 302A-C based at least in part upon which power bus bar 307A-C such a device is coupled to.

Power routing assemblies 306A-C are each coupled to a separate combination of power bus bars 307A-C. In some embodiments, one or more assemblies 306A-C are coupled to a common combination of power bus bars. Each power routing assembly routes power received from one or more of the coupled bus bars to a coupled downstream computing rack. In some embodiments, coupling various power routing assemblies to various power bus bars enables each of the various assemblies to provide various power support redundancies to the various downstream computing racks based at least in part upon which power bus bars each give power routing assembly is coupled to. For example, in the illustrated embodiment of FIG. 3A, power routing assembly is coupled to power bus bar 307A and 307B, and therefore can route power from one or more of power systems 302A and 302B to computing rack 312. Similarly, assembly 306B is coupled to bus bars 307A and 307C and can therefore route power from one or more of power systems 302A and 302C to computing rack 314, and assembly, coupled to bus bars 307B and 307C, can route power from one or more of power systems 302B and 302C to computing rack 316.

In some embodiments, where both power systems 302A and 302B are each primary power systems configured to provide fully-redundant power support to one or more electrical loads, power routing assembly 306A may provide 2N redundancy to computing rack 312, as shown. Similarly, where power system 302C is a reserve power system configured to provide at least partially-redundant reserve power support to one or more electrical loads, power routing assembly 306B and 306C may provide N+1 redundancy to their respective coupled computing racks 314 and 316.

In some embodiments, a power routing assembly provides breaker support for one or more power feeds that the assembly can route to a computing rack. The breaker support may be provided by one or more circuit breakers, which may be electrically coupled to one or more of the power bus bars to which a power routing assembly is coupled, and each circuit breaker may switch to isolate the power routing assembly from the coupled bus bar. In the illustrated embodiment, each power routing assembly 306A-C includes two of coupling modules 308A-F that are each coupled on an upstream side of the power routing assembly to a corresponding power bus bar, and each of which can include one or more circuit breakers that each provide breaker support to the downstream coupled computing rack for the power feed in the upstream coupled power bus bar. As an example, coupling module 308A is coupled to power bus bar 307A and includes a circuit breaker that provides breaker support to computing rack 312 for power from power system 302A. Each circuit breaker may operate automatically, for example in response to determination of a fault condition regarding the power received from the coupled power bus bar, manually, for example based upon a manual operation of an actuator lever on the circuit breaker module, etc. In some embodiments, a coupling module 308A-F includes a circuit breaker configured to be coupled directly to a power bus bar. In some embodiments, a coupling module includes a bus bar connector device that couples a circuit breaker connector to a power bus bar. Such a bus bar connector device may include a bus bar "clip" connector that can be received into a connector of the circuit breaker, thereby adapting the circuit breaker to couple with the power bus bar.

In some embodiments, a power routing assembly includes a power routing module that routes power received from one or more of the coupling modules in the assembly to a downstream coupled electrical load. The power routing module can include a switching device (e.g., an ATS) that is configured to selectively route power received from one of various coupled circuit breaker modules to the electrical load. For example, in the illustrated embodiment, power routing assemblies 306B and 306C each include a power routing module 310A, 310B that includes a switching device, where the switching device 310A can selectively route power received from one of the coupling modules 308C, 308D and the switching device 310B can selectively route power received from one of the coupling modules 308E, 308F. Such selective routing can include an automatic failover switching capability, where the switching device can automatically switch from a first received power feed to a second received power feed based at least in part upon a determined fault condition with regard to the first power feed. For example, in the illustrated embodiment, where power routing assembly 306B provides N+1 redundancy to computing rack 314, switch device 310A can automatically failover from primary power received from power system 302B via bus bar 307B and circuit breaker module 308C to reserve power received from power system 302C via bus bar 307C and coupling module 308D.

In some embodiments, a power routing module includes an electrical bridge that concurrently routes power received from multiple circuit breaker modules to a downstream coupled electrical load. For example, in the illustrated embodiment, power routing assembly 306A includes a power routing module 309 that includes an electrical bridge that concurrently routes power from both power systems 302A, 302B via respective power bus bars 307A-B and coupled circuit breakers in coupling modules 308A-B to computing rack 312. In some embodiments, power routing module 309 routes power from both power systems 302A-B to computing rack 312 via separate output power lines. Computing rack 312 may include an internally located transfer switch that may selectively switch between routing power from one of the output lines to one or more computer systems in the rack 312. In some embodiments, one or more of the coupling modules in a power routing assembly are included with the power routing module of the assembly in a common device. In some embodiments, one or more of the coupling modules in a power routing assembly are included in a separate device from a device that includes the power routing module of the assembly. For example, assembly 306A may comprise a single device with power routing module 309 and coupling modules 308A,B, where connectors from the single device couple to separate power bus bars 307A, 307B. In another example, assembly 306B may comprise three separate devices that each include a separate one of modules 310A, 308C, 308D, where the devices including modules 308C, 308D are each coupled to a separate power bus bar 307A, 307C and power routing module 310A.

Turning now to FIG. 3B, in some embodiments, a power support redundancy provided by a particular power routing assembly is changed based at least in part on at least partially adjusting the power routing assembly within a power routing rack to couple to a different one or more power bus bars in the power bus array, thereby routing one or more of a different set of power feeds to a downstream coupled electrical load. Such an adjustment may include changing a coupling of one or more of the coupling modules in a power routing assembly to couple to a different power bus bar, thereby receiving power from a different power system. For example, in the illustrated embodiment of FIG. 3B, while power routing assemblies 306A-B are unchanged from FIG. 3A, power routing assembly 306C is at least partially adjusted, where coupling modules 308E and 308F are changed from coupling to power bus bars 307B and 307C, respectively, to couple to power bus bars 307A and 307B, respectively. As a result, power routing assembly is changed from selectively routing power from one of power systems 302B and 302C to computing rack 316 to routing power from one of power systems 302A and 302B.

Furthermore, because, in the illustrated embodiment, power system 302C is a reserve power system while both power systems 302A-B are primary power systems, the adjustment of power routing assembly to couple coupling modules 308E and 308F with power bus bars 307A and 307B re-configures power routing assembly 306 from providing N+1 redundancy to computing rack 316 to providing 2N redundancy. As noted above, such adjustments involving power routing assembly 306C may include adjusting a position of one or more of coupling modules 308E, 308F with respect to rack 304, adjusting a position of the entire assembly 306C with respect to the rack 304 and bus array 305, etc.

Figure 4A:
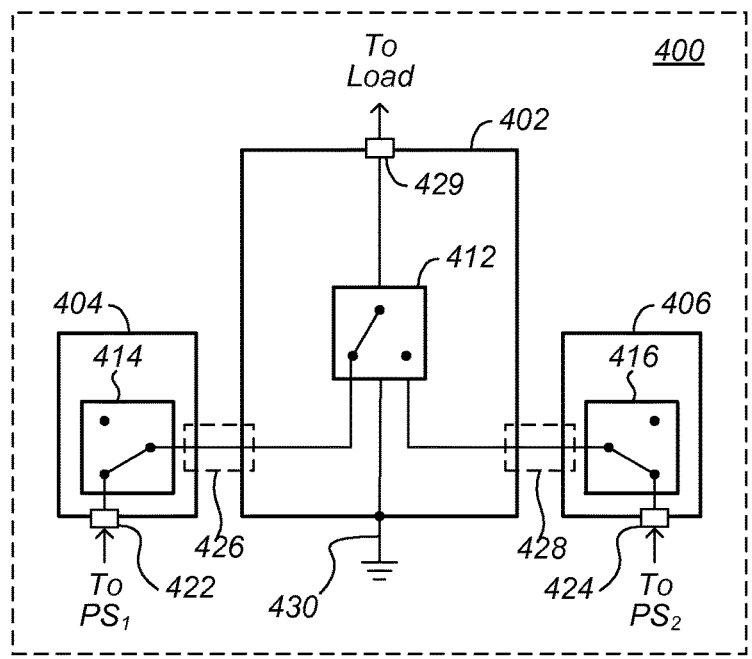
FIG. 4A and FIG. 4B are schematics illustrating power routing assemblies according to some embodiments.
Figure 4B:
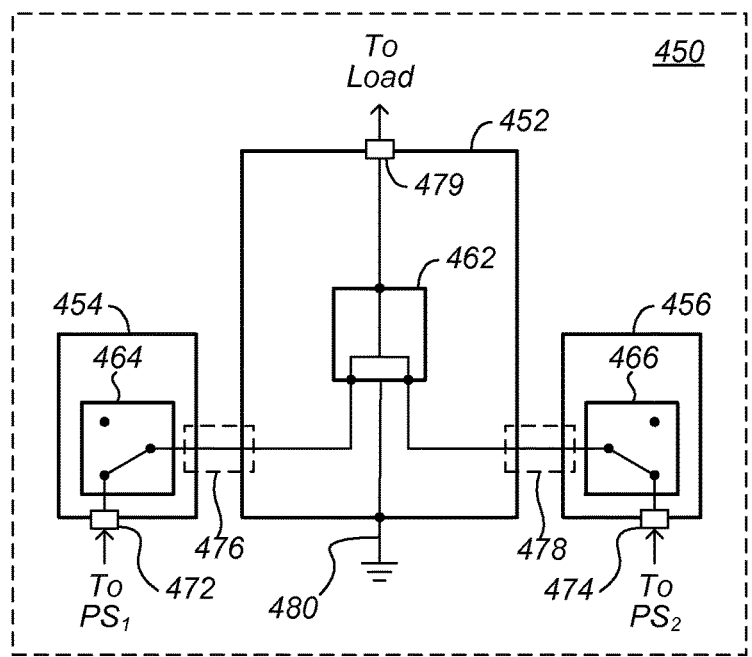

FIG. 4A and FIG. 4B are schematics illustrating power routing assemblies according to some embodiments. Each illustrated power routing assembly is configured to route power received from one or more power systems via one or more coupled power bus bars in a power bus array to a downstream coupled electrical load, which may include a computing rack and one or more computer systems included therein.

Turning first to FIG. 4A, a power routing assembly 400 includes a power routing module 402 and two coupling modules 404, 406 that each comprise a respective circuit breaker. Each coupling module includes a connector 422, 424 that couples to a separate power bus bar of a power bus array (not shown) to receive power carried by the coupled bus bar. Each coupling module also includes a respective circuit breaker 414, 416 that provides breaker support for the power feed received from the respective power bus bar via the respective connector 422, 424. In some embodiments, such as shown in the illustrated embodiment, each separate bus bar carries power received from a separate power system, and each circuit breaker 414, 416 provides breaker support for power feeds received from separate power systems. In some embodiments, each coupled power bus bar carries power from a common power system, and each circuit breaker 414, 416 provides breaker support for a separate power feed received from a common power system.

Each coupling module 404, 406 is coupled to power routing module 402 via a separate power connector 426, 428 of the power routing module 402. In some embodiments, one or more of the connectors 426, 428 is a fixed connector that, when coupled to a coupling module, fixes a position of a connector of the coupling module with respect to the power routing module. For example, where connector 426 is a fixed connector, coupling module 404 to power routing module 402 via connector 426 may fix a position of connector 422 with respect to power routing module 402. In some embodiments, a power connector is at least partially adjustable, and a position of a coupling module power connector with respect to the power routing module may be adjusted based at least in part on an adjustment of one or more of the power connector and the coupling module with respect to the power routing module. For example, connector 428 may include an adjustable connector, and one or more of connector 428 and coupling module 406 may be adjustably positioned with respect to power routing module 402. In some embodiments, each power connector is configured to be received into a coupling module power connector, which may comprise a power terminal of a corresponding circuit breaker of a circuit breaker module of the coupled coupling module and routes power from the corresponding circuit breaker connector to a routing element 412 of the power routing module 402. In some embodiments, the routing element is a switching device that selectively routes power received from one of the connectors 426, 428 to a downstream coupled electrical load via an output connector 429. The downstream coupled electrical load may include one or more computing racks.

In some embodiments, at least one part of power routing assembly 400 is coupled to an electrical ground. In the illustrated embodiment, for example, power routing assembly 400 is coupled to an electrical ground 430 through a fixed connection on power routing module 402. In some embodiments, power routing assembly 400 can be coupled to an electrical ground through a connector on one or more of coupling modules 404, 406, through a flux connector on one or more of the modules 402, 404, 406, etc.

Turning now to FIG. 4B, a power routing assembly 450 includes a power routing module 452 and two coupling modules 454, 456 that each comprise a respective circuit breaker module. Similarly to power routing assembly 400 illustrated in FIG. 4A, each coupling module includes a connector 472, 474, which may comprise one or more circuit breaker module connectors, that couples to a separate power bus bar of a power bus array (not shown) to receive power carried by the coupled bus bar, includes a respective circuit breaker 464, 466 that provides breaker support for the power feed received from the respective power bus bar via the respective connector 472, 474, and is coupled a power routing module 452 via a separate power connector 476, 478 of the power routing module 452. Also similarly to power routing assembly 400 of FIG. 3A, power routing assembly 450 includes a coupling to an electrical ground 480 via a fixed connection on power routing module 452.

In some embodiments, the routing element 162 is an electrical bridge that concurrently routes power received from multiple connectors 476, 478 to a downstream coupled electrical load via an output connector 479. In the illustrated embodiment, electrical bridge 462 concurrently routes power received from coupling module connectors 472 and 474 to an electrical load via a single output line. In some embodiments, electrical bridge 462 concurrently routes power received from multiple circuit breaker connectors to an electrical load via multiple respective output lines.

In some embodiments, and as referred to hereinafter, a "coupling module" that comprises one or more circuit breakers is referred to as a "circuit breaker module".

Figure 5A:
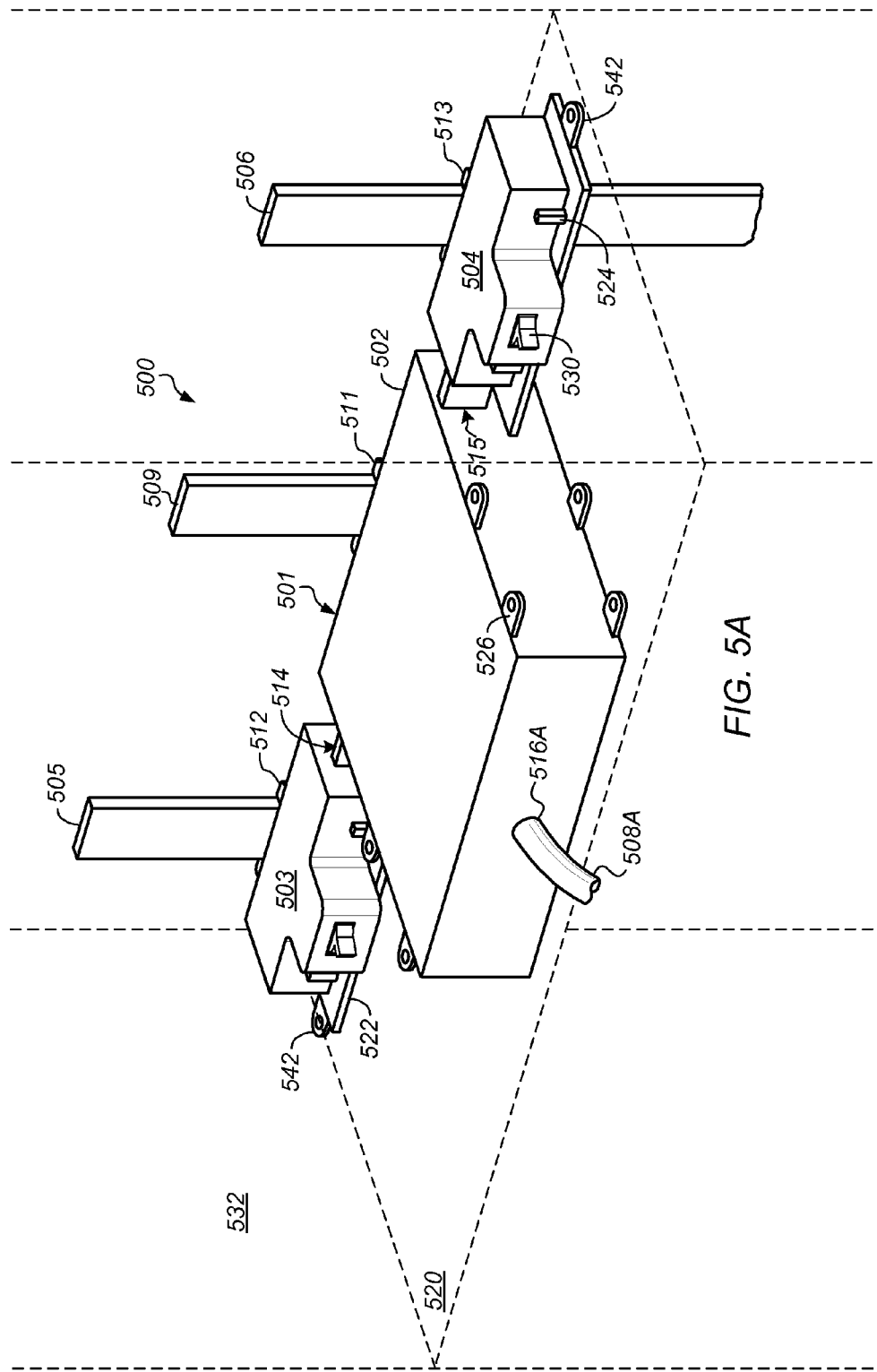
FIG. 5A is a schematic illustrating a perspective view of a power routing assembly configured to couple to, and route power from, one or more various bus bars of a power bus array according to some embodiments.

FIG. 5A is a schematic illustrating a perspective view of a power routing assembly configured to couple to, and route power from, one or more various bus bars of a power bus array according to some embodiments. Power routing rack 500 includes power bus bars 505, 506, and 509, a rack shelf 520, and a power routing assembly 501 that itself includes a power routing module 502 and two circuit breaker modules 503, 504.

In some embodiments, power routing assembly 501 includes a power routing module that couples to two or more circuit breaker modules and can route power received from one or more of the coupled circuit breaker modules to a downstream coupled electrical load. The power routing module 502 can couple to each separate circuit breaker module 503, 504 via corresponding separate power connectors 514, 515. Each power connector 514, 515 may be configured to be received into a power terminal of a circuit breaker module to which it is coupled. For example, where each circuit breaker module 503, 504 includes an industry-standard low-voltage circuit breaker, which may also include an actuator lever 530, coupling each power connector 514, 515 to a corresponding circuit breaker 503, 504 may include coupling the power connector to the corresponding circuit breaker terminal, and power routed through each circuit breaker 503, 504 may be passed to power routing module 502 through a corresponding coupled power connector 514, 515.

In some embodiments, each circuit breaker module 503, 504 in a power routing assembly can couple to a separate power bus bar in a power bus array. The circuit breaker module may include a circuit breaker module connector that is configured to connect to a power bus bar. In the illustrated embodiment, for example, each circuit breaker module 503, 504 includes a corresponding circuit breaker module 512, 513 that is configured to couple the circuit breaker module to one or more power bus bars in a power bus array, where the circuit breaker module coupled to a power bus bar can route power carried by the power bus bar to power routing module 502 and can further provide breaker support to downstream systems and components for the power feed from the coupled power bus bar. For example, in the illustrated embodiment, circuit breaker 503 is coupled to power bus bar 505 via connector 512 and can route power carried by power bus bar 505 to power routing module 502 and can further provide breaker support to one or more downstream systems and components by switching to isolate power routing assembly 501 from power bus bar 505. Similarly, circuit breaker 504 is coupled to power bus bar 506 via connector 513 and can route power carried by power bus bar 506 to power routing module 502 and can further provide breaker support to one or more downstream systems and components by switching to isolate power routing assembly 501 from power bus bar 506.

In some embodiments, at least one module of a power routing assembly is coupled to an electrical ground to electrically ground at least the module of the power routing assembly. For example, in the illustrated embodiment, bus bar 509 is an electrical ground bus bar, and power routing module 502 includes an electrical ground bus connector 511 that couples with bus bar 509 to electrically ground the power routing assembly 501. In some embodiments, one or more various modules of the power routing assembly are coupled with one or more electrical grounds to electrically ground at least a portion of the power routing assembly. For example, in some embodiments, one or more of modules 503, 504 may include an electrical ground connector that can couple with an electrical ground to electrically ground the power routing assembly 501. In some embodiments, an electrical ground may comprise a cable to an electrical ground, and an electrical ground connector on one or more modules of the power routing assembly may include an electrical ground cable connector.

In some embodiments, a power routing module in a power routing assembly includes a cable connector and is configured to route power received from one or more circuit breaker modules to a downstream coupled electrical load through an output cable. For example, in the illustrated embodiment, power routing module 502 includes an output connector 516A and is coupled via such connector 516A to an output cable 508A which may carry power output of power routing module 502 to one or more downstream electrical loads. Output cable 508A may couple power routing module 502 and a downstream electrical load, including a computing rack, directly or indirectly. For example, output cable 508A may extend through a power routing rack to an output cable junction, where the output cable 508A is coupled to another cable that extends from the power routing rack to the computing rack.

In some embodiments, a power routing assembly is configured to be adjustably positioned in one or more locations in a power routing rack. Such adjustable positioning of a power routing assembly can enable the power routing assembly to be positioned and re-positioned within a portion of a power routing rack to align one or more connectors of the power routing assembly to couple with various sets of power bus bars, thereby configuring the power routing assembly to route power from one or more various sets of power systems to a downstream coupled electrical load. In some embodiments, a power routing assembly may be positioned in a power routing rack at least partially based on being mounted on a shelf in the rack. For example, in the illustrated embodiment, power routing assembly 501 is mounted on a shelf 520 that may be vertically positioned within rack 500. The shelf 520 may be vertically adjustable along one or more wall portions 532 of rack 500 to vertically adjust the power routing assembly, provide structural support, etc. The power routing assembly may be laterally adjustable on shelf 520 to position the routing assembly to align connectors 512, 513 with various power bus bars. In some embodiments, the some or all of the routing assembly 501 itself is configured to be coupled to various attachment elements in rack 500 to position the assembly 501 in one or more positions within the rack 500. For example, routing module 502 may include one or more mounting portions 526 that can interface with one or more mounting portions in the rack (not shown) to affix at least a portion of the routing assembly 501 in a particular position within rack 500. In another example, routing assembly 501 may include one or more structural support elements 522, 524 that provide structural support to some or all of the assembly 501, including (as shown), circuit breaker modules 503, 504. Such structural support elements 522, 524 may include one or more mounting elements 542 that can interface with one or more mounting portions in the rack (not shown) to affix at least a portion of the routing assembly 501 in a particular position within rack 500. Adjusting a position of the power routing assembly may include adjusting one or more of mounting elements 542, 526, etc. to interface with various different mounting portions in rack 500 to affix at least a portion of the routing assembly 501 in one or more various positions in rack 500.

Figure 5B:
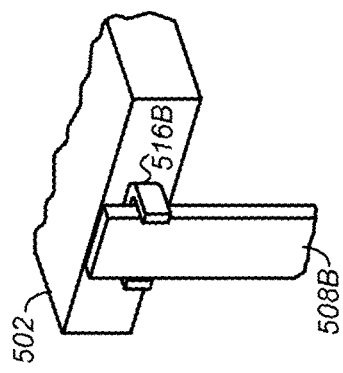
FIG. 5B is a schematic illustrating a routing module of a power routing assembly configured to supply power to a load according to some embodiments.

FIG. 5B is a schematic illustrating a routing module of a power routing assembly configured to supply power to a load according to some embodiments. In some embodiments, a power routing module in a power routing assembly includes a bus bar connector and is configured to route power received from one or more circuit breaker modules to a downstream coupled electrical load through an output power bus bar. For example, in the illustrated embodiment, power routing module 502 includes a bus bar connector 516B and is coupled via such connector 516B to an output power bus bar 508A which may carry power output of power routing module 502 to one or more downstream electrical loads. Output bus bar 508B may couple power routing module 502 and a downstream electrical load, including a computing rack, directly or indirectly. For example, output bus bar 508B may extend through a power routing rack to an output cable junction, where the output bus bar 508B is coupled to another cable that extends from the power routing rack to the computing rack.

Figure 5C:
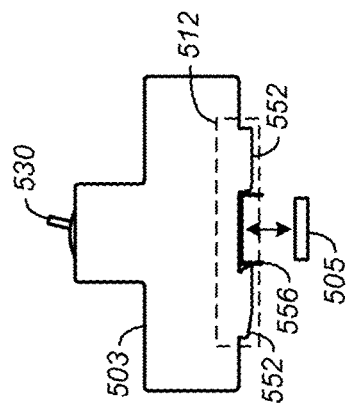
FIG. 5C is a schematic illustrating a circuit breaker module of a power routing assembly configured to couple to, and route power from, one or more various bus bars of a power bus array according to some embodiments.

FIG. 5C is a schematic illustrating a circuit breaker module of a power routing assembly configured to couple to, and route power from, one or more various bus bars of a power bus array according to some embodiments.

In some embodiments, a circuit breaker module includes a circuit breaker module connector that couples a circuit breaker connector to a power bus bar via an adapter connector. For example, in the illustrated embodiment, circuit breaker module 503 may include an industry-standard low-voltage circuit breaker with actuator lever 530 and industry-standard low-voltage circuit breaker connector 552, 554. In some embodiment, the connector 552 is coupled to a connector adapter 556 that couples connector 552 with power bus bar 505. Such a connector adapter may include a "clip" adapter that is held within connector 552 and "clips" the circuit breaker 503 to power bus bar 505. In some embodiments, the connector 552 is configured to couple the circuit breaker 503 with power bus bar 505. In such an embodiment, clip 556 may be absent, and circuit breaker module connector 512 may comprise connector 552, and circuit breaker module 503 may couple directly with power bus bar 505 through connector 552.

Figure 6A:
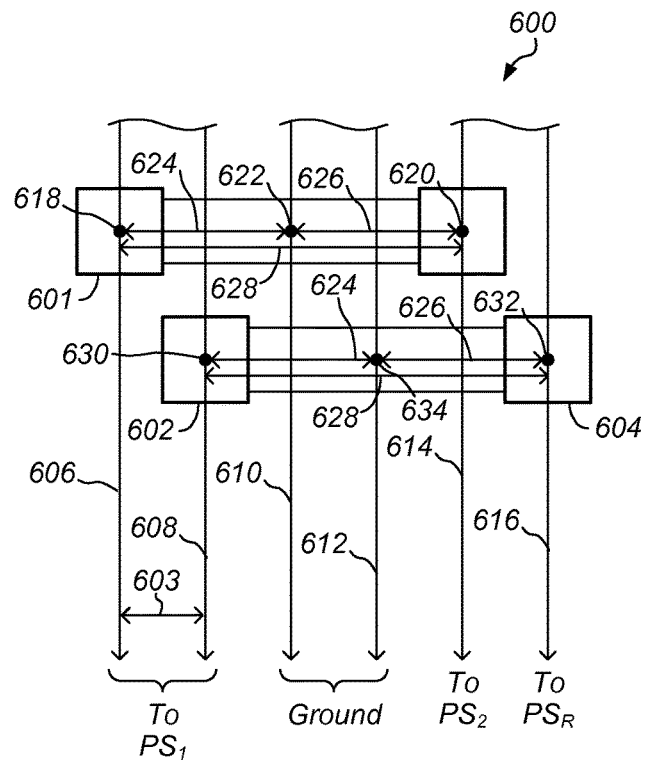
FIG. 6A is a schematic illustrating power routing assemblies coupled to various power bus bars of a single-phase power bus array to provide various power support redundancies according to some embodiments.

FIG. 6A is a schematic illustrating power routing assemblies coupled to various power bus bars of a single-phase power bus array to provide various power support redundancies according to some embodiments. The power routing rack 600 includes power routing assemblies 601, 602, and an array of power bus bars 606, 608, 610, 612, 614, 616 extending in parallel.

In some embodiments, a power routing rack includes a power bus array, where one or more power bus bars in the power bus array each carry a single particular phase, particular phase combination, etc. of power from one or more various power sources. The power bus bars in the power bus array may be arranged in a particular pattern so that a power routing assembly may be adjusted in the power routing rack to align one or more connectors to couple with one or more particular combinations of power bus bars in the power bus array. Enabling coupling with a particular combination of power bus bars may enable a power routing assembly to route power received from one or more particular power sources corresponding to the particular combination of power bus bars. For example, in the illustrated embodiment, each power bus bar 606, 608, 610, 612, 614, 616 is spaced an equal distance 603 from each adjacent power bus bar.

In some embodiments, a power routing assembly includes one or more systems and components that are spaced a particular distance apart, where the power routing assembly can be adjusted within the power routing rack to align connectors on the power routing assembly to particular spaced power bus bars in the power bus array based at least in part upon the position of the power routing assembly in the power routing rack. In the illustrated embodiment, each power routing assembly 601, 602 includes circuit breaker modules coupled to opposite sides of a power routing module, where the circuit breaker modules are coupled in a fixed position with respect to the power routing module and connectors on each circuit breaker module is spaced a particular distance from at least the power routing module. In addition, circuit breaker module connectors on each circuit breaker module may be spaced a particular distance apart, where the spacing of circuit breaker module connectors may correspond to a proportion of a spacing distance between two or more power bus bars in the power bus array. For example, in the illustrated embodiment, each power routing assembly 601, 602 includes circuit breaker modules with a corresponding circuit breaker module connector 618, 620, 630, 632 that is configured to couple the circuit breaker module to a power bus bar on the power bus array. Each power routing assembly 601, 602 includes circuit breaker modules and power routing module coupled in a fixed position with respect to each other, so that each connector pair 618, 620 and 630, 632 on each power routing assembly is spaced a common particular distance 628 apart. In the illustrated embodiment, the particular distance 628 corresponds to a four-fold proportion of the spacing 603 between adjacent parallel power bus bars, so that, when a particular power routing assembly is oriented perpendicular to the power bus bars and positioned so that one connector 618 of one circuit breaker module is aligned to couple with one power bus bar 606, the other connector 620 of the other circuit breaker module is aligned to couple with the power bus bar 614 that is offset from the first power bus bar 606 by four bus bars. Similarly, where power routing assembly 602 is positioned to align connector 630 to couple with power bus bar In some embodiments, various power bus bars in the power bus array carry power from various power sources in a particular arrangement, where positioning a power routing assembly to align the circuit breaker module connectors to couple with separate power bus bars configures the power routing assembly to route power from one or more of a particular combination of power sources. For example, in the illustrated embodiment, the power bus array includes a particular arrangement of parallel power bus bars carrying one or more various power feeds from one or more various power sources. Power bus bars 606 and 608 each carry power from a first primary power source, power bus bar 614 carries power from a second primary power source, power bus bar 616 carries power from a reserve power source, and power bus bars 610 and 612 are coupled to an electrical ground.

In the illustrated embodiment, as the power bus bars are spaced a particular distance and the power routing assemblies include modules coupled in fixed positions with respect to each other, positioning a power routing assembly to align the circuit breaker connectors to couple with separate power bus bars configures the power routing assembly to provide a particular power support redundancy to one or more downstream coupled electrical loads. For example, in the illustrated embodiment, where power routing assembly 601 is positioned to align connectors 618 and 620 to couple to power bus bars 606 and 614, respectively, power routing assembly 601 is configured to route power from one or more of the first primary power source and the second primary power system, thereby providing 2N redundancy to one or more downstream coupled electrical loads. In another illustrated example, where power routing assembly 602 is positioned to align connectors 630 and 632 to couple to power bus bars 608 and 616, respectively, power routing assembly 602 is configured to route power from one or more of the first primary power system and the reserve primary power system, thereby providing N+1 redundancy to one or more downstream coupled electrical loads.

In some embodiments, where both power routing assemblies include circuit breaker modules and power routing modules coupled in fixed positions with respect to each other, re-positioning one of the power routing assemblies to align its respective connectors to couple with a different set of power bus bars can change the power support redundancy provided by the power routing assembly. For example, horizontally adjusting the position of the power routing assembly 601 to align connectors 618, 620 to couple with power bus bars 608, 616, respectively changes the power routing assembly from providing 2N redundancy to providing N+1 redundancy. In addition, because the redundancy provided by a given power routing assembly is at least partially based on the power bus bars with which the connectors are aligned, the redundancy configuration of a given power routing assembly may be immediately ascertainable through visual observation of the power routing rack.

In addition, some embodiments of a power routing assembly include a fixed electrical ground connection, and the power bus array may include multiple power bus bars configured to couple one or more power routing assemblies to an electrical ground based at least in part on the position of the power routing assembly within the power routing rack. For example, in the illustrated embodiment, power routing rack 600 includes two parallel ground power bus bars 610, 612 that are spaced the particular distance 603 apart, so that each power routing assembly 601, 602, which each includes a respective ground connector 622, 634 that is spaced a particular set of distances 624, 626 apart from the circuit breaker module connectors, is aligned to couple its respective ground connector with one of the ground power bus bars based at least in part upon which combination of power bus bars the circuit breaker module connectors are aligned to couple with.

Figure 6B:
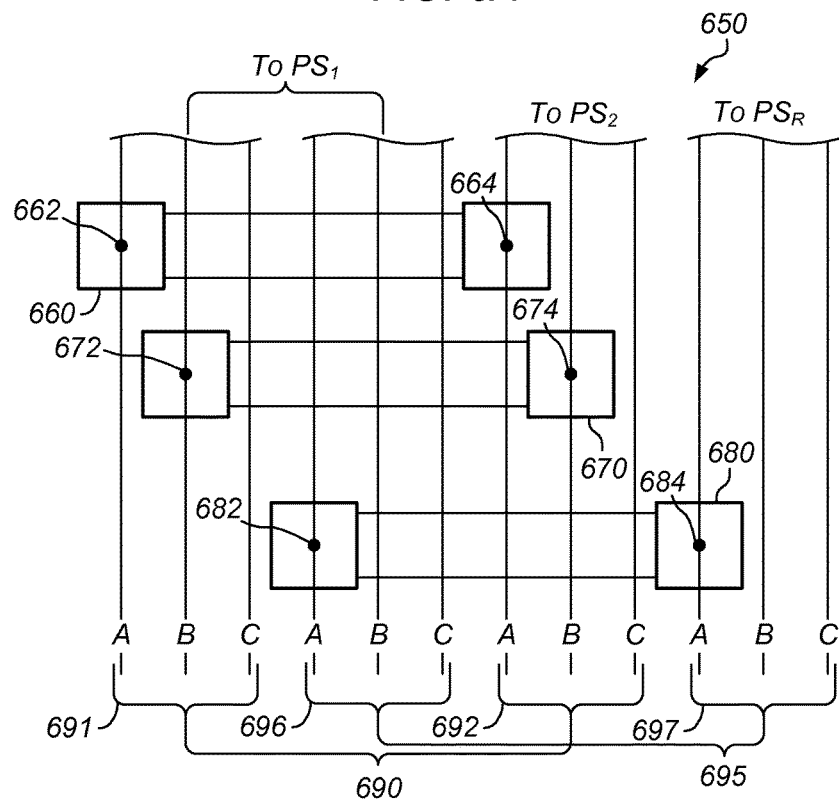
FIG. 6B is a schematic illustrating power routing assemblies coupled to various power bus bars of a multi-phase power bus array to provide various power support redundancies according to some embodiments.

FIG. 6B is a schematic illustrating power routing assemblies coupled to various power bus bars of a multi-phase power bus array to provide various power support redundancies according to some embodiments.

In some embodiments, one or more sets of power bus bars in a power bus array include power bars that carry various phases of power received from a particular power system. Such embodiments may include a three-wire delta configuration. For example, in the illustrated embodiment, power routing rack 650 includes a power bus array of multiple sets 691, 692, 696, 697 of power bus bars, where each set of power bus bars includes power bus bars that each carry a different phase of three-phase power received from a one of various power systems. Sets 691 and 696 may each include power bus bars that carry one phase of three-phase power received from a first primary power source. Set 692 include power bus bars that carry one phase of three-phase power received from a second primary power source. Set 697 include power bus bars that carry one phase of three-phase power received from a reserve primary power source. In some embodiments, one or more sets of power bus bars in a power bus array each include power bars that each carry various phase combinations of power received from a particular power system. For example, in a three-wire delta system that collectively carries three-phase (e.g., ABC) power, each power bus bar may carry one or more of an AB, BC, AC phase combination of power.

In some embodiments, a power routing assembly is configured to route power from one or more power systems via the power bus array based at least in part on positioning the power routing assembly to align at least two circuit breaker module connectors to couple with separate power bus bars in separate sets of power bus bars.

In some embodiments, where the power routing assemblies in a power routing rack include modules that are coupled in fixed positions with respect to each other, each power routing assembly may be positionable within a power routing rack to align two circuit breaker module connectors included therein to couple with separate power bus bars in a pair of sets of power bus bars. For example, in the illustrated embodiment, each power routing assembly 660, 670, 680 includes corresponding pairs of circuit breaker module connectors 662, 664, 672, 674, 682, 684 that are spaced a particular distance apart, where the particular distance corresponds to a distance between power bus bars of a common phase on two separate sets of power bus bars. As shown, power routing assembly 660 is positioned to align connectors 662, 664 to corresponding A-phase power bus bars of a first pair 690 of power bus bar sets 691, 692, so that the power routing assembly 660 is configured to route A-phase power from one of the first primary power source and the second primary power source to provide 2N redundancy to a downstream coupled electrical load. In addition, power routing assembly 670 is positioned to align connectors 672, 674 to corresponding B-phase power bus bars of the first pair 690 of power bus bar sets 691, 692, so that the power routing assembly 660 is configured to route B-phase power from one of the first primary power source and the second primary power source to provide 2N redundancy to a downstream coupled electrical load. Furthermore, power routing assembly 680 is positioned to align connectors 682, 684 to corresponding A-phase power bus bars of the second pair 695 of power bus bar sets 696, 697, so that the power routing assembly 680 is configured to route A-phase power from one of the first primary power source and the reserve primary power source to provide N+1 redundancy to a downstream coupled electrical load.

Figure 7:
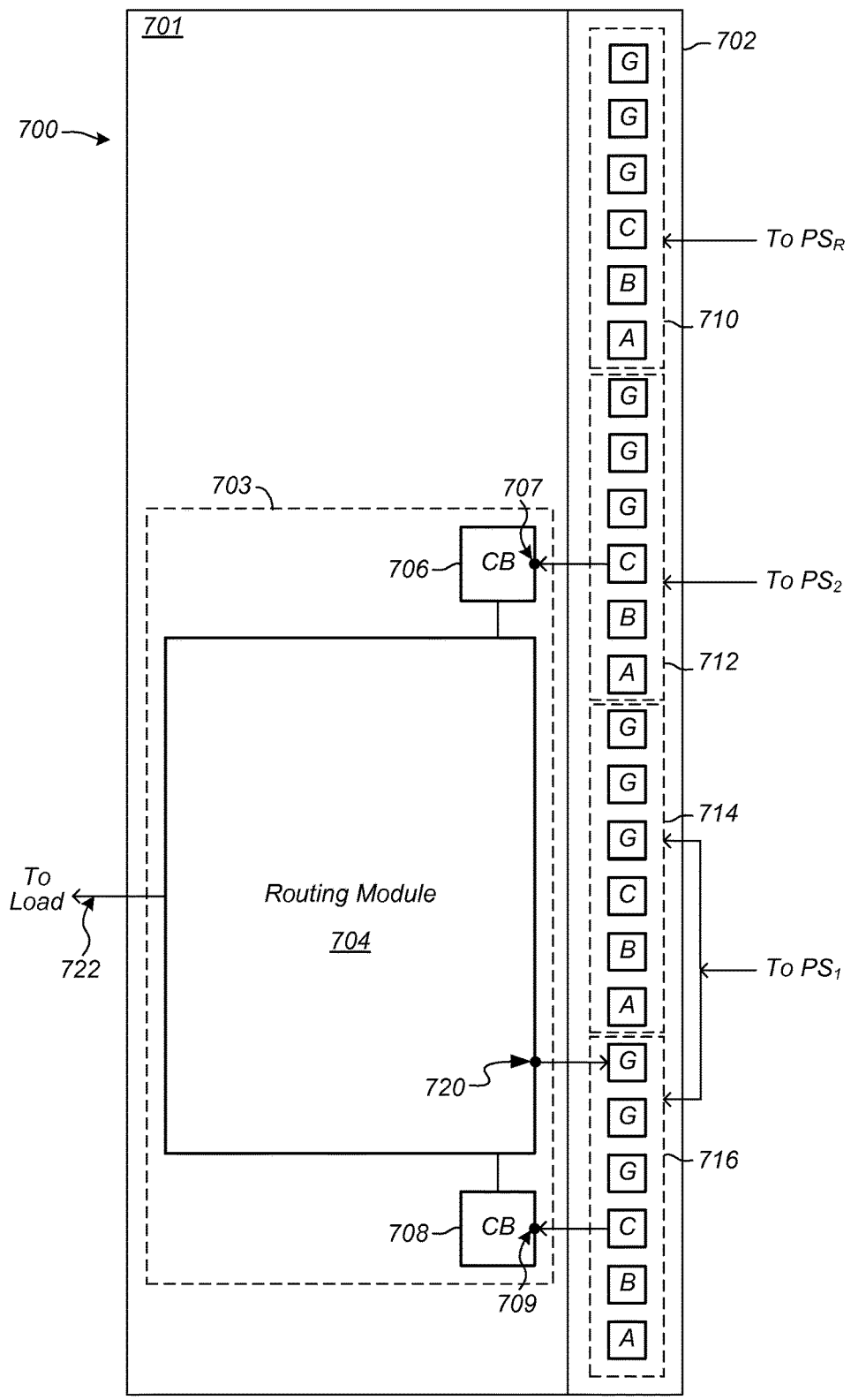
FIG. 7 is a schematic illustrating a vertical view of a power routing rack including a power bus array and a power routing assembly configured to be adjusted to couple to, and route power from, one or more various bus bars of the power bus array according to some embodiments.

FIG. 7 is a schematic illustrating a vertical view of a power routing rack including a power bus array and a power routing assembly configured to be adjusted to couple to, and route power from, one or more various bus bars of the power bus array according to some embodiments.

In some embodiments, a power routing rack includes a portion through which at least a portion of the power bus array extends and another portion into which one or more various power routing assemblies are adjustably mounted to couple with one or more power bus bars in the power bus array. For example, in the vertical ("top-down") view of power routing rack 700 in the illustrated embodiment, power routing rack 700 includes a routing assembly portion 701 into which one or more power routing assemblies 703 may be adjustably positioned, mounted, etc. and a power bus array portion 702 through which a power bus array extends. In some embodiments, multiple power routing assemblies 703 may be arranged vertically within portion 701. For the purposes of discussion, a single assembly 703 is shown in the vertical view of at least portion 701, although it will be understood that additional assemblies 703 may be positioned above and below the illustrated assembly 703, and multiple assemblies 703 may be coupled to various one or more bus bars in portion 702, including common bus bars. In the illustrated embodiment, the power bus array includes multiple sets 710, 712, 714, 716 of power bus bars that extend vertically and in parallel through portion 702. In some embodiments, the power bus bars in the power bus array portion 702 may extend horizontally, at an angle, some combination thereof, or the like.

In some embodiments, a power bus array includes multiple sets of power bus bars, where each set of power bus bars carries power received from one or more particular power sources via one or more particular power systems. Each set of power bus bars may include multiple power bus bars. Such embodiments may include a four-wire wye configuration. For example, where a power feed received from a power system includes multi-phase power, including three-phase power, one or more power bus bars in a given set of power bus bars may carry a separate phase of power received from the particular power system, and a neutral wire may be coupled to multiple ground bus bars corresponding to multiple potential positions of a ground connector of a routing assembly. In the illustrated embodiment, each set 710, 712, 714, 716 of bus bars includes three bus bars that each carry a separate phase (A, B, C) of power received from a particular power system. As also shown, each set of power bus bars receives power from one of three power systems (primary power system 1, primary power system 2, reserve power system), where two separate sets 714, 716 each receive power from a common primary power system 1.

As also shown in the illustrated embodiment, some embodiments of one or more sets of power bus bars includes one or more ground bar bars that are coupled to an electrical ground. Each of the ground bus bars in a set of power bus bars may be coupled to a common neutral wire in a four-wire wye system. As discussed further below, at least a part of a power routing assembly can couple with one or more of the ground bus bars to ground the power routing assembly.

In some embodiments, power bus bars in a power bus array are arranged in one or more particular arrangements to position two or more particular power bus bars in particular arrangements with respect to each other. For example, in the illustrated embodiment, power bus bars carrying a particular phase (A, B, or C) of power received from a particular power source are arranged within each respective set, and the sets themselves are also arranged within portion 702 to space power bars carrying a particular phase of power apart such that five other power bus bars, are interspersed between proximate power bus bars carrying a common phase. As further discussed below, arranging power bus bars according to one or more particular arrangements, in some embodiments, enables a power routing facility to be adjusted to align two or more circuit breaker module connectors to couple with separate power bus bars that each carry a common phase of power received from one or more various power systems.

In the illustrated embodiment, power routing assembly portion 701 includes one or more power routing assemblies 703 that route power from one or more power bus bars in portion 702 to a downstream coupled electrical load, which may include computer systems, servers, etc. in a computing rack. As shown, and as further discussed above in reference to previous figures, a power routing assembly 703 can include a power routing module 704 coupled to the load via one or more output connectors 722 and two circuit breaker modules 706, 708 coupled to the power routing module via separate power connectors of the power routing module 704. As also shown in the illustrated embodiment, each circuit breaker module 706, 708 may include a separate circuit breaker module connector 707, 709 that can couple with a power bus bar in the power bus array, where a circuit breaker module coupled to a power bus bar can route power from that power bus bar to the power routing module while providing breaking support to downstream systems and components for power from the power bus bar.

In some embodiments, at least some part of a power routing assembly is coupled to one or more electrical grounds to ground at least a part of the power routing assembly. A coupling to an electrical ground may be implemented via a ground connector located somewhere on the power routing assembly. The ground connector may include a fixed connector, and adjusting a power routing assembly within a power routing rack to position the power routing assembly to align circuit breaker modules to couple with separate power bus bars may include aligning a ground connector on the power routing assembly to couple with one or more various electrical grounds. For example, in the illustrated embodiment, power routing assembly 703 includes a ground connector 720 on power routing module 704 that is coupled to a ground bus bar with which the connector 720 is aligned. As shown and as noted above, a power bus array portion 702 may include multiple ground bus bars in one or more sets of power bus bars, where each ground bus bar is positioned within the array portion 702 so that the ground connector 720 of the power routing assembly will be aligned to couple with at least one of the ground bus bars if the power routing assembly is positioned to align the circuit breaker module connectors 707, 709 with any two separate power bus bars in portion 702. In the illustrated embodiment, power routing assembly 703 is positioned to align connectors 707, 709 with separate power bus bars carrying C-phase power in sets 712, 716, so that power routing assembly 703 can route C-phase power from one of the first primary power system and the second primary power system.

In some embodiments, the spacing of ground bus bars and corresponding power bus bars matches the approximate spacing of a ground connector and at least one circuit breaker module connector in a power routing assembly, so that aligning the circuit breaker module connector with a power bus bar in the power bus array also aligns the ground connector with a corresponding ground bus bar. For example, in the illustrated embodiment, connector 720 is spaced from connector 709 by a particular distance that corresponds with the spacing between each power bus bar and a corresponding ground bus bar in each power bus bar set in portion 702. Therefore, aligning connector 709 with the C-phase power bus bar of set 716 aligns connector 720 with a ground bus bar that corresponds to the C-phase power bus bar of set 716.

In some embodiments, a power routing assembly includes a power routing module and circuit breaker modules that are coupled in fixed positions with respect to each other, where the circuit breaker module connectors of the power routing assembly are spaced a particular distance apart. In the illustrated embodiment, for example, where modules 704, 706, 708 are coupled in fixed positions with respect to each other, connectors 707 and 709 are spaced a particular distance apart. In some embodiments, one or more power bus bars in a power bus array are spaced apart a distance that corresponds to the particular distance between circuit breaker module connectors, so that aligning one of the circuit breaker modules to couple with one of the power bus bars will align the other circuit breaker module connector with another particular power bus bar spaced apart from the first power bus bar by the particular distance. For example, in the illustrated embodiment, corresponding power bus bars of a common phase in alternating sets of power bus bars (e.g., sets 716 and 712, sets 714 and 710) are spaced a particular distance that corresponds to the fixed distance between connectors 707, 707 of power routing assembly 703. Adjustably positioning power routing assembly 703 within portion 701 to align connector 709 to couple with one of the power bus bars carrying a phase of power in set 716 or 714 also aligns connector 707 to couple with a corresponding power bus bar in set 712 or 710, respectively, that carries a common phase with the power bus bar to which connector 709 is aligned to couple. Because each set of power bus bars may carry power from one or more various power systems, where a power system may include a primary power system, reserve power system, etc., positioning power routing assembly 703 in portion 701 to align connectors 707, 709 to couple with various separate power bus bars in two of sets 710, 712, 714, 716 will configure power routing assembly 703 to provide a particular power support redundancy to a downstream coupled electrical load. For example, in the illustrated embodiment, where power routing assembly 703 is positioned to align connectors 707, 709 to couple with C-phase power bus bars in sets 712, 716, where set 716 of power bus bars carries power from primary power system 1 and set 712 of power bus bars carries power from primary power system 2, power routing assembly 703 is configured to provide 2N power support redundancy to a downstream coupled electrical load. In another example, where assembly 703 is positioned to align connectors 707, 709 to couple to power bus bars carrying A-phase power in power bus bar sets 710, 714, where set 714 of power bus bars carries power from primary power system 1 and set 710 of power bus bars carries power from a reserve power system, power routing assembly 703 is configured to provide N+1 power support redundancy to a downstream coupled electrical load.

Figure 8:
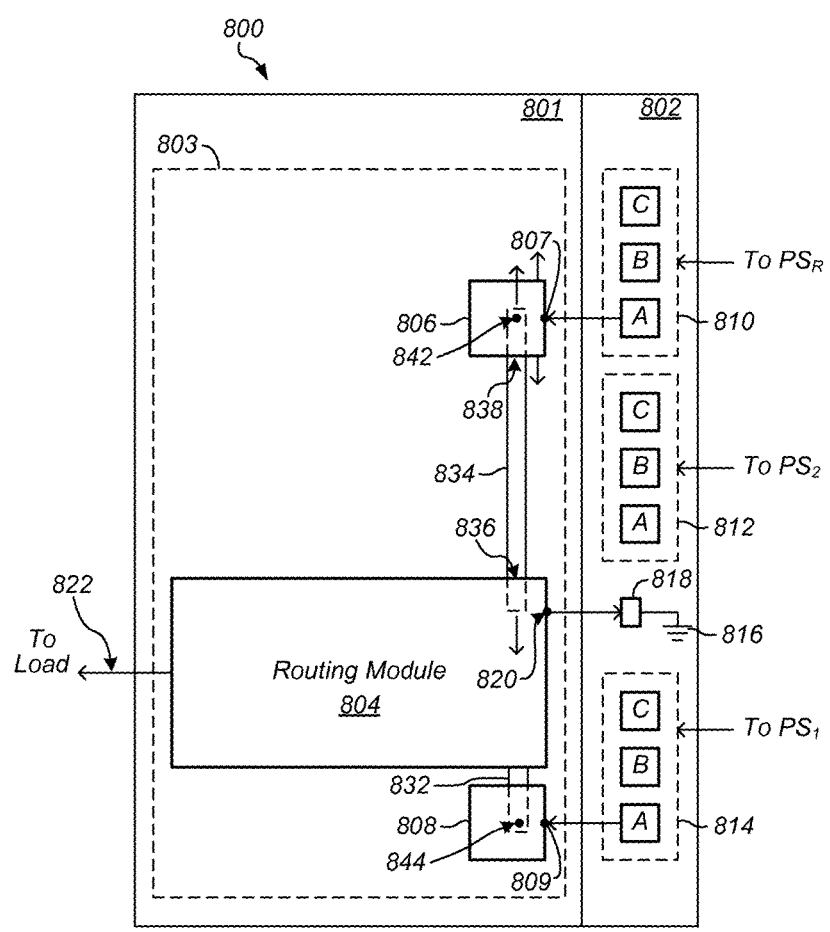
FIG. 8 is a schematic illustrating a vertical view of a power routing assembly configured to be at least partially adjusted to couple to, and route power from, one or more various bus bars of a power bus array according to some embodiments.

FIG. 8 is a schematic illustrating a vertical view of a power routing assembly configured to be at least partially adjusted to couple to, and route power from, one or more various bus bars of a power bus array according to some embodiments.

In some embodiments, a power routing assembly includes a power routing module and circuit breaker modules where one or more of the modules can be adjustably positioned with respect to the other modules. In such embodiments, the power routing assembly may be adjustably positioned within a power routing rack by adjusting a position of one or more of the modules of the power routing assembly without appreciably adjusting a position of one or more other modules of the power routing assembly.

In the vertical ("top-down") view of power routing rack 800 in the illustrated embodiment, power routing rack 800 includes a routing assembly portion 801 into which one or more power routing assemblies 803 with one or more adjustably positionable modules may be adjustably positioned, mounted, etc. and a power bus array portion 802 through which a power bus array extends. In the illustrated embodiment, the power bus array includes multiple sets 810, 812, 814 of power bus bars that extend vertically and in parallel through portion 802. In some embodiments, the power bus bars in the power bus array portion 802 may extend horizontally, at an angle, some combination thereof, or the like. Power routing assembly 803 includes a power routing module 804 that is coupled to circuit breaker modules 806, 808 through separate power connectors 834, 832.

In some embodiments, one or more of the power connectors is coupled to one or more of the circuit modules in a fixed position, so that the circuit breaker module is coupled in a fixed position with respect to the power routing module. For example, power connector 832 may couple circuit breaker module 808 in a fixed position with respect to routing module 804. Connector 832 may be received into a terminal of the circuit breaker module 808 to couple with a connector element 844, and power received into the circuit breaker module 808 from a coupled power bus bar via connector 809 may be routed into routing module 804 via connector 832.

In some embodiments, one or more of the power connectors is adjustably coupled to one or more of the circuit modules in one or more various positions, so that the circuit breaker module can be adjustably positioned in various positions with respect to the power routing module. For example, power connector 834 may couple circuit breaker module 806 in one or more various adjustable positions with respect to routing module 804. Connector 834 may be received into a terminal 838 of the circuit breaker module 806 to couple with a connector element 842, and power received into the circuit breaker module 806 from a coupled power bus bar via connector 807 may be routed into routing module 804 via connector 834. Connector 834 may couple with routing module 804 via a terminal 836.

As shown in the illustrated embodiment, in some embodiments one or more of a power connector and a circuit breaker module may be adjustable to adjustably position the circuit breaker module to align with one or more various power bus bars in a power bus array. In some embodiments, the power connector 834 is fixed in a particular position with respect to power routing module 804, and circuit breaker module 806 can be adjustably positioned to couple with connector 834 at one or more various points along the length of connector 834. Circuit breaker module 806 may be slidably adjusted along the length of connector 834 to couple element 842 with connector 834 at one or more various points along the length of connector 834.

In another example, and as shown in the illustrated embodiment, connector 834 itself may be adjustable to adjust the position of circuit breaker module 806 with respect to routing module 804. For example, connector 834 may be slidably received into terminal 836 and coupled to module 806 at a fixed position on connector 834 via element 842, so that the position of circuit breaker module 806 with respect to module 804 may be adjusted by adjusting connector 834 to extend away from, or retract towards module

804. In the illustrated embodiment, module 806 is positioned to align connector 807 to couple with an A-phase power bus bar in power bus bar set 810, such that module 806 can route A-phase power from a reserve power system that is carried through the set 810 of power bus bars to routing module 804 and assembly 803 is configured to provide N+1 power support redundancy to one or more downstream coupled electrical loads via at least connector 822. In another example, one or more of module 806 and connector 834 may be adjusted to adjustably position module 806 to align connector 807 with the A-phase power bus bar of power bus bar set 812, such that module 806 can route A-phase power from a second primary power system that is carried through the set 810 of power bus bars to routing module 804 and assembly 803 is configured to provide 2N power support redundancy to one or more downstream coupled electrical loads via at least connector 822.

In some embodiments, a power bus array includes one or more electrical ground bus bars that are independent of one or more sets of power bus bars in the array. Where a power routing assembly includes one or more modules that remain in a fixed position while one or more other modules are adjustably positioned to re-configure the power support redundancy configuration of the power routing assembly, the "fixed" one or more modules may include a fixed ground connector. Because the fixed module does not appreciably move when other modules are adjustably positioned, the ground connector on the fixed module may maintain a coupling with a given ground bus bar while other modules are coupled to various different power bus bars. For example, in the illustrated embodiment, where power routing module 804 remains in an appreciably fixed horizontal position while module 806 is adjustably positioned in a horizontal direction to align connector 807 to couple with various power bus bars, connector 820 remains in a fixed position and may remain coupled to a single ground bus bar. Therefore, power bus array portion 802 may include a vertically-extending single ground bus bar 818 coupled to the ground 816, and each power routing assembly 803 in portion 801 may couple to ground bus bar 818 at one or more various points along its vertical length through portion 802 to ground each assembly 803.

Figure 9:
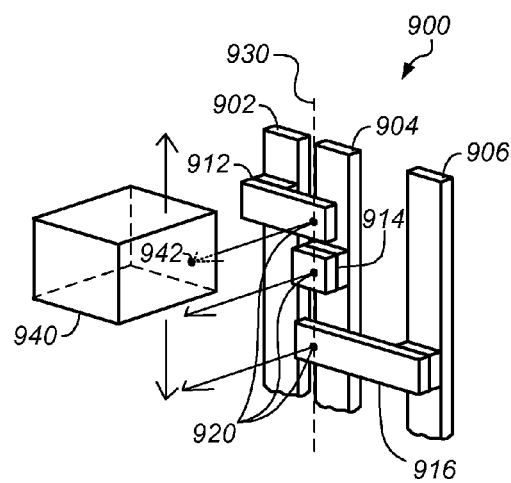
FIG. 9 is a schematic illustrating a perspective view of a set of power bus bars including tang connectors configured to couple to one or more systems and components at various positions on a common axis.

FIG. 9 is a schematic illustrating a perspective view of a set of power bus bars including tang connectors configured to couple to one or more systems and components at various positions on a common axis.

In some embodiments, one or more various power bus bars in a set of power bus bars includes a tang connector coupled to the power bus bar, where each tang connector of each power bus bar in the set extends at least to various positions on a common axis, so that a device may be aligned to couple to one or more of various bus bars in the set of bus bars by being adjustably positioned align the common axis to align a connector of the device with one of the tang connectors.

For example, in the illustrated embodiment, a set 900 of power bus bars, which may be included in a power bus array of a power routing rack, includes three power bus bars 902, 904, 906 that are extending vertically in parallel, where each power bus bar is horizontal offset from the other power bus bars. Each power bus bar 902, 904, 906 includes at least one tang connector 912, 914, 916 that extends from the respective power bus bar to at least one respective position 920 on a common axis 930. As shown in the illustrated embodiment, a device 940 may be adjustably positioned parallel to the common axis 930 to align a connector 942 of the device 940 with one or more of the various positions 920 on the axis corresponding to a tang connector of a particular bus bar. As a result, the device 940 may be adjustably positioned in a first direction along an axis to align connector 842 to couple with one or more various bus bars that are arranged in a second direction that may, in some embodiments, be perpendicular to the first direction. In some embodiments, device 840 includes at least a portion of a power routing assembly, including a circuit breaker module, and the power routing assembly may be adjustably positioned parallel to axis 930 to align one or more circuit breaker module connectors 942 to couple with one or more various power bus bars 902, 904, 906 via a particular position 920 of a corresponding tang connector 912, 914, 916 on the axis 930.

Figure 10:
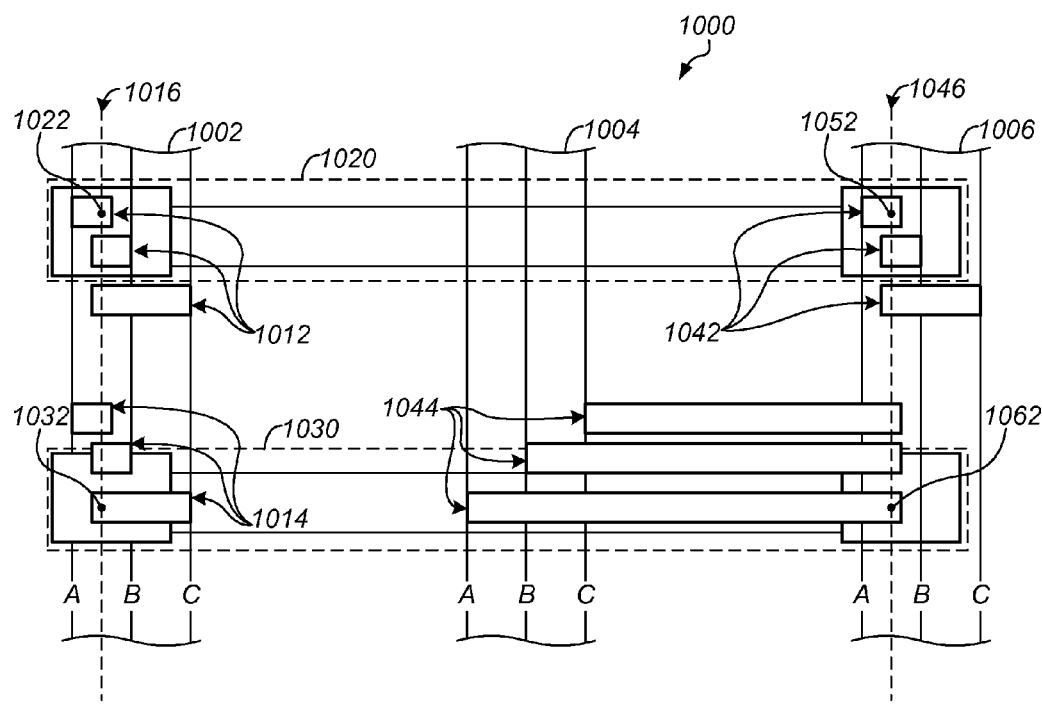
FIG. 10 is a schematic illustrating power routing assemblies coupled to various power bus bars of a multi-phase power bus array on one or more common axes via tang connectors to provide various power support redundancies according to some embodiments.

FIG. 10 is a schematic illustrating power routing assemblies coupled to various power bus bars of a multi-phase power bus array on one or more common axes via tang connectors to provide various power support redundancies according to some embodiments. Power routing rack 1000 includes multiple sets 1002, 1004, 1006 of power bus bars included in a power bus array, where each set includes three power bus bars extending vertically and in parallel with respect to each other and other power bus bars in other sets.

As discussed above with reference to FIG. 9, in some embodiments one or more power bus bars in one or more sets of power bus bars include one or more tang connectors that extend from the power bus bar to at least one position on a common axis. Each power bus bar may include multiple tang connectors that extend from the power bus bar to various separate positions on the common axis. For example, as shown in the illustrated embodiment, each power bus bar in set 1002 includes two separate tang connectors 1012, 1014 that extend from the respective power bus bar to at least one separate position on a common axis 1016. Each power bus bar in set 1002 may each have a tang connector of one or more various sets 1012, 1014 of tang connectors, where each set of tang connectors includes a tang connector of each power bus bar in the power bus bar set that extend to proximate positions on the common axis 1016.

As further shown in the illustrated embodiment, power routing assemblies 1020, 1030 can be vertically adjustably positioned within power routing rack 1000 to couple to separate tang connectors in separate tang connector sets. Because the tang connectors in each set 1012, 1014 of tang connectors extend to proximate positions on a common vertical axis 1016, each power routing assembly may be adjustably positioned in a vertical direction to align one or more various connectors, including one or more circuit breaker connectors to one or more various power bus bars that are horizontally offset from the one or more connectors. For example, power routing assembly 1020 may be adjustably positioned in a vertical direction to align circuit breaker module connector 1022 to couple with an A-phase power bus bar of set 1002, where such alignment includes aligning connector 1022 on common axis 1016 with a particular tang connector of the A-phase power bus bar, so that connector 1022 is coupled to the A-phase power bus bar, although the connector 1022 may not be horizontally aligned with the A-phase power bus bar itself. Similarly, power routing assembly 1030 may be adjustably positioned in a vertical direction to align circuit breaker module connector 1032 to couple with a C-phase power bus bar of set 1002, where such alignment includes aligning connector 1032 on common axis 1016 with a particular tang connector of the C-phase power bus bar, so that connector 1032 is coupled to the C-phase power bus bar, although the connector 1032 may not be horizontally aligned with the C-phase power bus bar itself.

In some embodiments, power bus bars of separate power bus bar sets may each include one or more tang connectors that extend from the power bus bar to at least one position on a common axis. For example, as shown in the illustrated embodiment, each power bus bar in each separate set 1004, 1006 includes separate tang connectors 1042, 1044 that each extend from the respective power bus bar in the respective set of power bus bars to at least one separate position on a common axis 1046. Each power bus bar in the separate sets 1004, 1006 may each have a tang connector of one or more various sets 1042, 1044 of tang connectors, where each set of tang connectors includes a tang connector of each power bus bar in each power bus bar set that extend to proximate positions on the common axis 1046.

In some embodiments, where tang connectors of power bus bars of separate sets of power bus bars extend to a common axis, and where separate sets of power bus bars carry power received from separate power systems, power routing assemblies can be adjustably positioned parallel to the common axis to couple to separate tang connectors in separate tang connector sets, where each set of tang connectors extends from a separate set of power bus bars, so that adjusting a power routing assembly parallel to the common axis to align a connector to couple to tang connectors of separate tang connector sets couples the power routing assembly to receive power from a separate power system via a particular power bus bar, although the various sets of power bus bars carrying power from various power systems may be offset from the common axis. For example, in the illustrated embodiment, a power routing assembly 1020, 1030 can be adjusted in a vertical direction to align a circuit breaker module connector to couple with separate power bus bars carrying power from separate power systems, although the separate power bus bars may be horizontally offset from each other. Power routing assembly 1020 may be adjustably positioned in a vertical direction to align circuit breaker module connector 1052 to couple with an A-phase power bus bar of set 1006, where such alignment includes aligning connector 1052 on common axis 1046 with a particular tang connector of the A-phase power bus bar, so that power routing assembly 1020 can receive power from a particular power system feeding power to the set of power bus bars 1006, although the connector 1022 may not be horizontally aligned with the A-phase power bus bar in set 1006 itself. Similarly, power routing assembly 1030 may be adjustably positioned in a vertical direction to align circuit breaker module connector 1062 to couple with a C-phase power bus bar of set 104, where such alignment includes aligning connector 1062 on common axis 1016 with a particular tang connector of the C-phase power bus bar, so that power routing assembly 1030 can receive power from a particular power system feeding power to the set of power bus bars 1004, although the connector 1032 may not be horizontally aligned with the C-phase power bus bar itself.

In some embodiments, various sets of tang connectors may be aligned along separate respective common axes, where positioning a power routing assembly to align one circuit breaker module connector with a tang connector in one set of tang connectors will align another circuit breaker module connector with another tang connector in the other set of tang connectors. Where a power bus array includes multiple sets of power bus bars that each include power bus bars carrying power from various power systems, various aligned pairs of tang connector sets may correspond to particular combinations of power feeds from particular combinations of power systems. Therefore, a power routing assembly may be configured to route power from a particular combination of power systems, and thereby provide a particular power support redundancy to a downstream coupled electrical load, based at least in part upon positioning the power routing assembly to align circuit breaker module connectors with particular tang connectors of a particular pair of tang connector sets. For example, as shown in the illustrated embodiment, where power bus bar sets 1002, 1004, 1006 each carry three-phase power from separate power systems, tang connector sets 1012, 1042 may be aligned as a pair of tang connector sets, so that positioning a power routing assembly 1020 to align connectors 1022, 1052 to corresponding tang connectors of tang connector sets 1012, 1042 may configure the power routing assembly 1020 to route power from one or more of the power systems feeding power to power bus bar sets 1002, 1006.

Similarly, tang connector sets 1014, 1044 may be aligned as another pair of tang connector sets, so that positioning a power routing assembly 1030 to align connectors 1032, 1062 to corresponding tang connectors of tang connector sets 1014, 1044 may configure the power routing assembly 1030 to route power from one or more of the power systems feeding power to power bus bar sets 1002, 1004, thereby configuring power routing assembly 1030 to route power from a separate combination of power systems than power routing assembly 1020.

Figure 11:
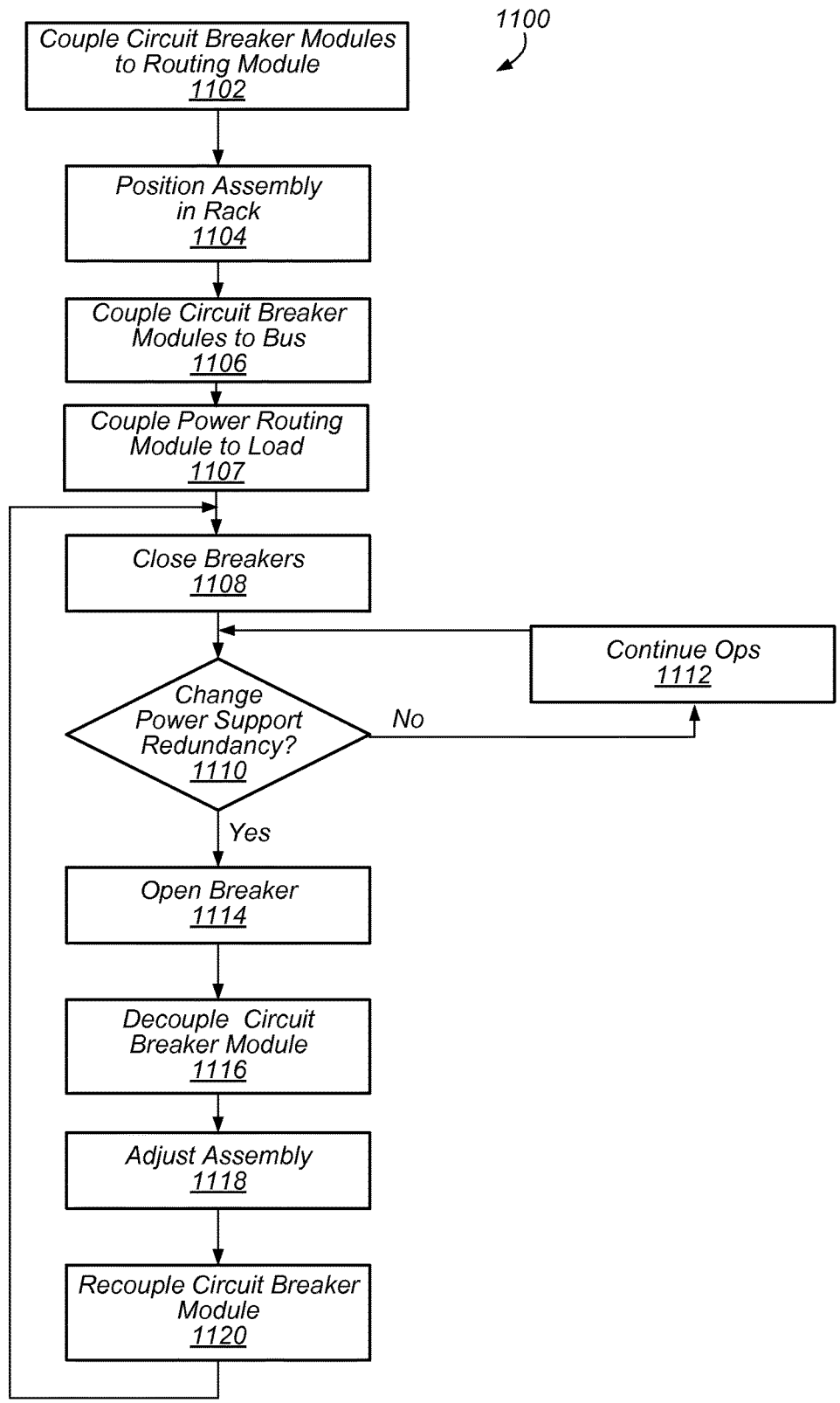
FIG. 11 is a flow diagram illustrating operation of systems and components of to provide one or more power support redundancies to downstream electrical loads according to some embodiments.

FIG. 11 is a flow diagram illustrating operation 1100 of systems and components of to provide one or more power support redundancies to downstream electrical loads according to some embodiments. At 1102, one or more circuit breaker modules are coupled to a power routing module to assemble a power routing assembly. In some embodiments, the power routing module includes one or more separate power connectors to which separate circuit breaker modules are coupled to couple the circuit breaker modules to the power routing module. A power connector may be received into a power terminal of a circuit breaker module, and each circuit breaker module may be coupled to the power routing module via the power connector so that the circuit breaker module can route power from the circuit breaker module to the power routing module via the coupling power connector. In some embodiments, a circuit breaker module is coupled to a power routing module via a power connector in a fixed connection, such that the circuit breaker module is coupled in a fixed position with respect to the power routing module. In some embodiments, a circuit breaker module is adjustably coupled to a power routing module via a power connector, such that the circuit breaker module is coupled in one or more various positions with respect to the power routing module. One or more of the circuit breaker module or the power connector may be adjustable to reposition the circuit breaker module with respect to the power routing module.

At 1104, the power routing assembly is positioned in one or more particular positioned in a power routing rack. In some embodiments, the power routing rack includes multiple shelves, and positioning the power routing assembly includes mounting the assembly in one of the shelves. In some embodiments, the power routing rack and the power routing assembly includes one or more various mounting elements, where one or more various sets of mounting elements in the power routing rack correspond to one or more various positions of the power routing assembly in the rack. In such embodiments, the power routing assembly may be at least partially positioned in a particular position in the power routing rack based at least in part upon interfacing one or more mounting elements of the power routing assembly with one or more sets of mounting elements of the power routing rack.

At 1106, one or more circuit breaker modules of the power routing assembly are coupled to one or more power bus bars in a power bus array extending at least partially through a portion of the power routing rack. For example, where the power bus array includes multiple sets of power bus bars extending vertically and in parallel on one side of the power routing rack, one or more circuit breaker modules in a power routing assembly are aligned to couple with one or more separate power bus bars in the power bus array. In some embodiments, coupling one or more of the circuit breaker modules to separate power bus bars configures the power routing assembly to route power received from one or more of the power bus bars to one or more downstream coupled electrical loads.

At 1107, the power routing module is coupled to a downstream electrical load, where the power routing assembly is configured to route power from one or more of the power bus bars to the load. The load may include one or more computer systems, which may be located in one or more computing racks. Coupling a power routing module to a load may include coupling the routing module to an output cable via an output connector. In some embodiments, the power routing module is coupled to an output power bus extending through a part of the power routing rack via a bus bar connector, where the output power bus bar may couple with an output power line that extends at least partially between the power routing rack and the load.

At 1108, one or more circuit breakers in the circuit breaker modules are closed. When a circuit breaker module is coupled to a power bus bar, one or more circuit breakers in the module may be opened to preclude power from immediately flowing from the power bus bar to the power routing module. Closing the circuit breakers enables the power routing module to receive power from the power bus bar. In some embodiments, the power routing module routes power from multiple power bus bars to a downstream coupled electrical load. In some embodiments, including where the power routing module includes a transfer switch, the power routing module selectively routes power from one or more power bus bars.

In some embodiments, coupling circuit breaker modules to one or more power bus bars and coupling a power routing module to one or more downstream electrical loads configured the power routing assembly to route power from one or more of the power bus bars to the load. A power routing assembly configured to route power from one or more power bus bars to a load may be configured to provide a particular power support redundancy for the load. For example, where a power routing assembly includes two circuit breaker modules that are each coupled to separate power bus bars, where the power bus bars each carry power from a separate power system, the power routing assembly is configured to provide power support redundancy to a downstream load using power feeds from the separate power systems. Where the separate power systems are both primary power systems, the power routing assembly may be configured to provide 2N redundancy to the load. Where the separate power systems include a primary power system and a reserve power system, the power routing assembly may be configured to provide N+1 redundancy to the load.

As shown at 1110, a determination is made whether to change the particular power support redundancy configuration of the power routing assembly, so that the power routing assembly provides a different particular power support redundancy to a load. For example, where the power routing assembly provides 2N redundancy by routing power from one or more separate primary power systems to a load, the determination at 1110 may include a determination whether to change the power routing assembly to provide N+1 redundancy to the same load. If not, at 1112, operations are continued.

If, at 1114, the power support redundancy configuration of a power routing assembly is to be changed, the circuit breakers of one or more circuit breaker modules of the power routing assembly are opened to isolate the power routing assembly from a coupled power bus bar. At 1116, a circuit breaker module, which may include the circuit breaker module within which a breaker is opened at 1114, is decoupled from a power bus bar.

At 1118, at least a portion of the power routing assembly is adjustably positioned to align one or more circuit breaker modules to couple with one or more separate power bus bars. In some embodiments, such adjustably positioning includes adjusting the entire power routing assembly within a power routing rack to couple two or more circuit breaker module connectors with two or more new power bus bars with which the modules were not previously coupled. For example, where a power routing assembly includes modules coupled in fixed positions with respect to each other, the entire power routing assembly may be repositioned in the power routing rack to align the circuit breaker module connectors with two separate power bus bars. The repositioning may include unmounting the power routing assembly from a portion of the rack, including a shelf, one or more sets of mounting elements, some combination thereof, or the like and mounting the power routing assembly to another portion of the rack, including another shelf, one or more other sets of mounting elements, some combination thereof, or the like. In some embodiments, such adjustably positioning includes adjusting the position of a portion of the power routing assembly within the rack and maintaining a position of another portion of the power routing assembly within the rack. For example, where one of the circuit breaker modules in a power routing assembly can be adjustably positioned with respect to at least the power routing module, via adjustment of one or more of the circuit breaker module, power connector, etc., the adjustably positioning may include adjusting the circuit breaker module from being aligned with one power bus bar to being aligned to couple with another power bus bar.

At 1120, one or more circuit breakers are re-coupled to the power bus array at one or more particular power bus bars. The power bus bars to which one or more circuit breaker modules are coupled may be separate from the power bus bars from which one or more circuit breaker modules are decoupled at 1116. Where the power routing assembly is coupled to a separate set of power bus bars that each carry power from a separate set of power systems from another set of power bus bars from which the power routing assembly was decoupled, the power routing assembly may be reconfigured from providing one power support redundancy to a downstream coupled electrical load to providing another power support redundancy to the load. For example, where a power routing assembly initially routes power from one or more of two power bus bars each carrying power from a primary power system and a reserve power system, respectively, such that the power routing assembly initially provides N+1 redundancy to a load, decoupling the power routing assembly from at least one of the power bus bars and coupling the power routing assembly to another combination of separate power bus bars each carrying power from the primary power system and another primary power system, respectively, may configure the power routing assembly to provide 2N power support redundancy to the load.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center comprising:
a primary power system configured to supply a primary power feed;
a reserve power system configured to supply a reserve power feed;
a plurality of computing racks each comprising one or more sets of computer systems; and
one or more power routing racks comprising:
a power bus array of power bus bars extending in parallel along a first side of a portion of the power routing rack, the power bus array comprising:
one or more sets of primary power bus bars configured to carry the primary power feed;
one or more sets of reserve power bus bars, extending in parallel to the primary power bus bars and configured to carry the reserve power feed; and
a plurality of power routing assemblies, each mounted in separate positions within the portion of the power routing rack, that are each configured to provide one or more particular power support redundancies to at least one of the one or more sets of computer systems;
wherein:
the plurality of computing racks are downstream from the one or more power routing racks; and
to provide one or more particular power support redundancies to at least one of the one or more sets of computer systems, each power routing assembly is configured to route at least one of the primary power feed or the reserve power feed to at least one of the one or more sets of computer systems, wherein each of the plurality of power routing assemblies mounted in a particular position comprises:
a circuit breaker module configured to reversibly couple with one of the primary power bus bars such that the circuit breaker module selectively routes the primary power feed via a local power output connection;
another circuit breaker module configured to reversibly couple with one of the reserve power bus bars such that the other circuit breaker module selectively routes the reserve power feed via another local power output connection; and
a power routing module separately connected to each of the power output connections of the circuit breaker modules via separate local power input connections and configured to route at least one of the primary power feed or the reserve power feed to at least one of the one or more sets of computer systems via at least one power output connection.

2. The data center of claim 1, wherein:
each one or more sets of power bus bars comprises a particular parallel arrangement of one or more power bus bars along the first side of the power routing rack, and
each one or more sets of power bus bars is configured, based at least in part on the particular parallel arrangement of power bus bars, to enable each circuit breaker module in a given power routing assembly to selectively couple to separate power bus bars of a particular pair of a primary power bus bar and a reserve power bus bar based at least in part upon a particular position of the power routing assembly within the power routing rack.

3. The data center of claim 1, comprising:
a secondary power system configured to supply a secondary power feed;
wherein the power bus array further comprises:
one or more sets of secondary power bus bars, extending in parallel to the one or more sets of primary power bus bars and the one or more sets of reserve power bus bars and configured to carry the secondary power feed; and
wherein at least one of the power routing assemblies is configured to reversibly change a power support redundancy provided to the one or more sets of computer systems, wherein, to reversibly change a power support redundancy provided to the one or more sets of computer systems, the at least one power routing assembly is configured to be at least partially re-positioned to decouple the other circuit breaker module from the reserve power bus bar and couple the other circuit breaker module to at least one of the secondary power bus bars, such that the other circuit breaker module selectively routes the secondary power feed via the other local power output connection.

4. The data center of claim 1, wherein the one or more power routing racks comprises two power routing assemblies mounted within the power routing rack, wherein:
one of the two power routing assemblies mounted within the power routing rack comprises a routing module that includes an automatic transfer switch configured to selectively switch between routing one of two power feeds received from separate circuit breaker modules in the one power routing assembly; and
another one of the two power routing assemblies mounted within the power routing rack comprises a routing module that includes a bridging connection configured to concurrently supply power from both power feeds received from separate circuit breaker modules in the other power routing assembly;
wherein each of the two power routing assemblies is configured to provide a separate power support redundancy to separate one or more sets of computer systems.

5. An apparatus comprising:
a power routing assembly configured to be mounted in a portion of a power routing rack, the power routing assembly comprising:
at least two circuit breaker modules, each of the circuit breaker modules is configured to reversibly couple with a separate power system via a separate power bus bar and selectively route a power feed supplied from the separate power system via the coupled power bus bar to an output connector of the respective circuit breaker module; and
a power routing module coupled to each of the output connectors of the circuit breaker modules via a respective power input connector and further coupled to a downstream electrical load via a power output connector, wherein the downstream electrical load is mounted in a rack that is downstream from the power routing rack;
wherein the power routing module is configured to route at least one power feed from at least one of the circuit breaker modules to the downstream electrical load via the respective power input connector;
wherein the power routing assembly is configured to be adjustably positionable within the portion of the power routing rack to selectively couple at least one of the circuit breaker modules to one of a plurality of bus bars in a power bus array to selectively route a power feed from one of the plurality of power bus bars through the at least one of the circuit breaker modules.

6. The apparatus of claim 5, wherein the power routing module comprises an electrical bridge configured to concurrently supply power from at least two separate power feeds to the downstream electrical load via at least two of the respective power input connectors.

7. The apparatus of claim 5, wherein the power routing module comprises an automatic transfer switch configured to selectively route one of at least two power feeds to the downstream electrical load via one of the respective power input connectors.

8. The apparatus of claim 5, wherein:
each of the plurality of power bus bars carries a power feed supplied by a separate power system; and
to selectively couple at least one of the circuit breaker modules to one of a plurality of power bus bars in the power bus array, the power routing assembly is configured to:
  decouple the at least one circuit breaker module from one of the plurality of power bus bars supplying power from one power system, and
  couple the at least one circuit breaker module to another one of the plurality of power bus bars supplying power from another power system, such that the power routing assembly switches from routing a power feed from one power system to routing another power feed from the other power system.

9. The apparatus of claim 5, wherein at least one of the separate power input connectors is configured to adjustably couple a circuit breaker module in one or more positions relative to the power routing module to align the circuit breaker module to couple with one of a plurality of power bus bars in a bus bar array.

10. The apparatus of claim 5, wherein:
each of the at least two circuit breaker modules are coupled in a fixed position relative to the power routing module, such that the circuit breaker modules are spaced a particular distance corresponding to a particular distance between at least two power bus bars in at least two sets of power bus bars in the power bus array; and
the power routing assembly is configured to be adjustably positioned in one of a plurality of positions within the portion of the power routing rack, wherein each of the plurality of positions corresponds to one of the sets of power bus bars, such that the at least two circuit breaker modules in the power routing assembly are aligned to couple with at least two power bus bars in a particular set of power bus bars based at least in part upon the position in which the power routing assembly is positioned.

11. The apparatus of claim 10, wherein:
each of the power bus bars in a given set of power bus bars comprises a tang connector extending from the respective power bus bar to a position on a common axis extending parallel to the given set of power bus bars; and
the power routing assembly is configured to be adjusted vertically within the portion of the power routing rack to align at least one of the circuit breaker modules to couple with a particular tang connector, such that the at least one circuit breaker module is aligned to couple with a particular power bus bar in a given set of power bus bars based at least in part upon the particular tang connector with which the circuit breaker module is aligned to couple.

12. The apparatus of claim 10, wherein the power routing assembly is configured to provide one of a plurality of power support redundancies to the downstream electrical load based at least in part upon the position in which the power routing assembly is positioned.

13. A method comprising:
assembling a power routing assembly, wherein assembling the power routing assembly comprises coupling at least two circuit breaker modules to separate power connectors of a power routing module; and
configuring the power routing assembly to provide a particular power support redundancy from a power routing rack that includes the power routing assembly to a downstream electrical load in a rack that is downstream from the power routing rack, wherein configuring the power routing assembly to provide the particular power support redundancy to the downstream electrical load comprises:
  configuring each of the circuit breaker modules to route separate power feeds from a power bus array to the routing module via separate circuit breaker module connectors, wherein configuring each of the circuit breaker modules to route separate power feeds from the power bus array comprises:
    adjusting a position of the power routing assembly within a portion of the power routing rack; and
    coupling each of the circuit breaker modules to separate power bus bars of the power bus array; and
  configuring the power routing module to route at least one of the separate power feeds received from the circuit breaker modules to the downstream electrical load, wherein configuring the power routing module to route at least one of the separate power feeds comprises coupling the power routing module to the electrical load via a power output connection.

14. The method of claim 13, wherein:
coupling the at least two circuit breaker modules to the separate power connectors comprises adjustably coupling a one of the circuit breaker modules to a given power connector of the separate power connectors at one of a plurality of positions on the given power connector to align the one of the circuit breaker modules to couple with a particular power bus bar of the power bus array.

15. The method of claim 13, wherein:
the power routing module comprises an automatic transfer switch configured to selectively route one of at least two power feeds to the downstream electrical load via one of the respective power input connectors; and configuring the power routing module to route at least one of the separate power feeds comprises configuring the power routing module to selectively route one of the separate power feeds to the downstream electrical load via the power output connection.

16. The method of claim 13, wherein:

configuring the power routing assembly to provide a particular power support redundancy to a downstream electrical load comprises configuring the power routing assembly to provide a particular one of a plurality of power support redundancies to the downstream electrical load; and configuring the power routing assembly to provide a particular one of a plurality of power support redundancies to the downstream electrical load comprises selectively positioning the power routing assembly in a particular corresponding position of a plurality of positions within the power routing rack, wherein each of the plurality of positions corresponds with a separate power support redundancy.

17. The method of claim 13, wherein:

the power bus array comprises at least one set of at least two power bus bars spaced a particular distance apart, wherein each separate power bus bar in a given set is configured to carry a separate power feed;

coupling the at least two circuit breaker modules to the separate power connectors comprises coupling each of the circuit breakers in a fixed position relative to the power routing module, such that the at least two circuit breaker modules are spaced a particular distance corresponding to the particular distance between the at least two power bus bars; and coupling each of the circuit breaker modules to separate power bus bars of the power bus array comprises positioning the power routing assembly to align each of the circuit breaker modules to couple with a separate one of the at least two power bus bars.

18. The method of claim 17, wherein:

the power bus array comprises at least two separate pairs of power bus bars, each power bus bar in a given pair carrying a separate power feed and each pair of power bus bars collectively carrying a separate set of power feeds;

coupling each of the circuit breaker modules to separate power bus bars of the power bus array comprises positioning the power routing assembly at a particular position to align each of the circuit breaker modules to couple with at least two power bus bars of a particular pair of power bus bars, such that the power routing assembly is configured to route at least one of a particular set of power feeds; and the method further comprises re-configuring the power routing assembly to provide another power support redundancy to the downstream electrical load, wherein re-configuring the power routing assembly to provide another power support redundancy comprises re-positioning at least a portion of the power routing assembly from the particular position to another position corresponding to another pair of power bus bars to align each of the circuit breaker modules with at least two power bus bars of the other pair of power bus bars, wherein the other pair of power bus bars is configured to carry another set of power feeds.

19. The method of claim 18, wherein:

at least one power bus bar in each of the at least two separate pairs of power bus bars comprises a tang connection extending from the respective power bus bar to a first common axis extending parallel to each power bus bar in the power bus array;

at least one other power bus bar in each of the at least two separate pairs of power bus bars comprises another tang connection extending from the respective other power bus bar to a second common axis extending parallel to each power bus bar in the power bus array;

wherein the first common axis and the second common axis are spaced apart by a particular distance corresponding to the particular distance between the circuit breaker modules in the power routing assembly; and coupling each of the circuit breaker modules to separate power bus bars of the power bus array comprises positioning the power routing assembly at a particular position to align each of the circuit breaker modules to couple with a separate tang connection on a separate one of the first axis and second axis.

* * * * *